United States Patent
Vabnick et al.

(10) Patent No.: US 11,519,945 B2
(45) Date of Patent: Dec. 6, 2022

(54) CIRCUIT TEST DEVICE AND METHOD

(71) Applicant: Federal Bureau of Investigation, Washington, DC (US)

(72) Inventors: Ian B. Vabnick, Quantico, VA (US); Michael Malone, Quantico, VA (US)

(73) Assignee: The United States of America as Represented by the Federal Bureau of Investigation, Department of Justice, Washington, DC (US)

(*) Notice: Subject to any disclaimer, the term of this patent is extended or adjusted under 35 U.S.C. 154(b) by 2 days.

(21) Appl. No.: 17/125,105

(22) Filed: Dec. 17, 2020

(65) Prior Publication Data

US 2021/0190836 A1    Jun. 24, 2021

Related U.S. Application Data

(60) Provisional application No. 62/951,495, filed on Dec. 20, 2019.

(51) Int. Cl.
*G01R 31/54* (2020.01)
*G01R 19/165* (2006.01)
*G01R 31/58* (2020.01)
*G01R 31/327* (2006.01)

(52) U.S. Cl.
CPC . *G01R 19/16504* (2013.01); *G01R 19/16528* (2013.01); *G01R 31/54* (2020.01); *G01R 31/58* (2020.01); *G01R 31/3277* (2013.01)

(58) Field of Classification Search
CPC ............... G01R 31/54; G01R 31/58; G01R 19/165–16523; G01R 19/16528; G01R 19/16566; G01R 19/16595
See application file for complete search history.

(56) References Cited

U.S. PATENT DOCUMENTS

| | | | | |
|---|---|---|---|---|
| 4,027,236 A | * | 5/1977 | Stewart | G01R 31/54 324/133 |
| 4,130,794 A | * | 12/1978 | Cox | G01R 31/60 379/25 |
| 4,527,118 A | * | 7/1985 | Koslar | G01R 19/16561 324/133 |
| 5,177,447 A | * | 1/1993 | Marino | G01R 31/007 701/99 |

(Continued)

*Primary Examiner* — Patrick Assouad
*Assistant Examiner* — Demetrius R Pretlow
(74) *Attorney, Agent, or Firm* — Leydig, Voit & Mayer, Ltd.

(57) ABSTRACT

Circuit test devices and methods are provided. The method includes measuring a voltage between first and second conductor points (CPs) of a circuit under test (CUT), and determining if the measured voltage is less than a low voltage threshold value (LVTV) indicative of electrical continuity (EC) between the first and second CPs. In response to determining that the measured voltage is less than the LVTV, the method includes: transmitting a test signal (TS) to the first or second CP, and determining if the test signal is received after being transmitted. In response to determining that the TS is received, a presence of EC between the first and second conductor points is reported, and in response to determining that the TS is not received, absence of EC between the first and second CPs, or a lack of electrical contact between the VMC and the first and/or second CP(s), is reported.

21 Claims, 12 Drawing Sheets

(56) References Cited

U.S. PATENT DOCUMENTS

| | | | | |
|---|---|---|---|---|
| 5,477,133 | A * | 12/1995 | Earle | G01R 31/54 340/407.1 |
| 5,756,926 | A * | 5/1998 | Bonbrake | F42D 1/05 175/3 |
| 5,969,626 | A * | 10/1999 | Maciel | G01R 31/54 340/649 |
| 7,768,292 | B1 * | 8/2010 | Koch | G01R 31/40 324/764.01 |
| 10,634,732 | B2 * | 4/2020 | Warmack | G01R 31/54 |
| 2006/0119368 | A1 * | 6/2006 | Sela | H02J 7/0042 324/522 |
| 2009/0189597 | A1 * | 7/2009 | Lagerberg | G01R 19/2503 324/133 |
| 2014/0312685 | A1 * | 10/2014 | Moga | G01R 31/55 307/9.1 |
| 2016/0274168 | A1 * | 9/2016 | Cabot | G06F 11/221 |
| 2016/0363620 | A1 * | 12/2016 | Choe | G01R 31/2829 |
| 2017/0059638 | A1 * | 3/2017 | Griffiths | G01R 1/06788 |
| 2019/0049509 | A1 * | 2/2019 | Warmack | G01R 31/52 |
| 2021/0072326 | A1 * | 3/2021 | Lee | G01R 31/70 |
| 2021/0367528 | A1 * | 11/2021 | Aikawa | H02M 7/06 |
| 2022/0024344 | A1 * | 1/2022 | Kim | G01R 19/165 |

\* cited by examiner

CIRCUIT TEST DEVICE AND METHOD

CROSS-REFERENCE TO RELATED APPLICATIONS

This application claims the benefit of and priority to U.S. Provisional Patent Application No. 62/951,495 filed Dec. 20, 2019, which is specifically incorporated by reference in its entirety to the extent not inconsistent herewith.

STATEMENT OF GOVERNMENT INTEREST

The inventions described herein were invented by employees of the United States Government and thus, may be manufactured and used by or for the U.S. Government for governmental purposes without the payment of royalties.

TECHNICAL FIELD

Provided herein is technology related to circuit test devices and methods, and more particularly to devices, systems and methods that assess electrical continuity and circuit state in circuits under test (CUTs).

BACKGROUND

Checking continuity is a common function in explosives demolition and in CounterIED (C-IED) bomb disposal operations to verify circuit connections are intact. Also, determining the integrity of an electrical connection or line has commercial application in the blasting and telecommunications industries, for example. Working with explosive initiators such as detonators, electric matches and squibs have additional safety aspects that require limiting the current induced during a continuity check. Conventional methods of checking continuity are analog and not digital in nature. A voltage is applied and a current is induced through the electronic connection test points or contacts. The word "continuity" is defined as a low resistance or impedance value between two points in an electrical circuit, two electrical contacts, or legs of a circuit component. An alternate description of continuity is that electrical current will readily flow between two points in a circuit. For the purposes of this disclosure, "electrical connectivity" is a more general term and means that two points are connected through a circuit network composed of conductors and passive electronic elements such as resistors and capacitors.

Generally speaking, for electrical continuity testing, a resistance value range of 0.0001 ohms ($\Omega$) to 0.1$\Omega$ is reasonable for most short conditions, short lengths of wire, closed switches, solder joints, or shunted wires. The term "electrical short condition" refers to an unintended connection with low resistance between two points in a circuit, wherein the low resistance refers to the resistance of a conductor bridging the two points in the circuit. A low resistance is defined herein as a load between the two points in the circuit having a resistance of greater than 0$\Omega$ and less than or equal to 100$\Omega$. For low power and medium powered electrical systems, measuring the voltage across any of the components or conditions described above typically results in a value of 0.0001 volts (V) to 1 V. Occasionally, some switches have higher resistances, but typically no higher than 100$\Omega$ as an upper limit for switch resistance. In these cases, voltage measurements are typically below 0.5 V.

Known techniques of checking continuity through a low resistance load, such as a detonator, commonly involve inducing a voltage across the component. The component is either removed from a circuit in order to check it or it is tested prior to inserting it into a circuit. Known test devices and methods put a precision resistor in series with the load under test. A current is passed through both resistors using a variable voltage source. The fraction of the voltage drop across the test load is proportional to the size of its resistance. The resistance can be calculated after knowing the voltage applied, the value of the precision resistor, and the voltage drop. A consequence of the measurement according to such known techniques is a small current induced through the element being tested. Known multimeters and continuity test equipment will indicate there is electrical connectivity when the resistance value is below a defined resistance threshold. For example, a common value used for this purpose is 50$\Omega$. In order for such known test methods to be accurate, no power can be applied to the circuit network or circuit elements being tested. The voltage applied by the ohmmeter can be several volts and, under a specific resistive load, for example, can be 6 V. While in a continuity mode, known meters' short circuit current needs to meet the blasting industry's safety requirement of producing a current no more than $\frac{1}{10}$-th the no-fire condition for the specific detonator. The phrase "no-fire condition" refers herein to the power or current through a bridgewire that will not cause functioning of at least 99.9% of detonators.

For example, in blasting systems with active continuity monitoring using known devices and techniques, the voltage output of the fire control unit/panel is generally in the range of 0.001 V to 0.2 V. At least some known meters are not safe to use because they may induce currents that are too high and may cause a detonator to explode. Blaster's ohmmeters are available and are specifically designed to be safe for detonator continuity checks, but at least some known continuity check equipment approved for explosives operations do not have digital readouts and use a vibrator or a light to indicate continuity. While such known devices, systems and methods provide binary output systems that are simple to use and provide easily interpreted results so as to minimize operator errors in assessing the integrity of firing lines, a firing network, or a detonator, known devices and techniques may not provide an integrated platform providing enough functionality to efficiently cover various operational scenarios encountered by users in practice with a single test unit.

Another tool commonly used in the blasting industry is the galvanometer. The galvanometer measures the amount of current flowing through an inductive coil. The coil is part of an electromagnet and combined with permanent magnets drive an armature connected to a needle gauge. The magnetic force is counteracted by a spring mechanism to keep the needle at the pre-test position. The needle deflection lines up with the resistance value printed on the gauge face. Galvanometers were designed to measure current, however, when a load is measured outside of a circuit and a known voltage and current limiting resistor is used in series with the load being measured, the galvanometer inductive coil current is proportional to the resistance of the load in question. The magnetic field induced in the coil is proportional to the size of the current and thus the load resistance. The precise resistance value is not required, although in the blasting industry, knowing this value indicates the state of the bridge wires and firing line resistance. This information is needed to insure that a blasting machine can output enough power and energy to reliably function a network of blasting caps and that the network of wire and blasting caps are electrically connected.

An alternative method that can only be applied to powered electronic systems is to independently measure current and voltage between the two points where a continuity check is desired. Ohm's law (V=IR) states the ratio of voltage over current is equal to the resistance (V/I=R). Voltage measurements are relatively easy to conduct, however, current measurements can be challenging or near impossible. Indirect current measurements depend on the magnetic field produced as current flows through a conductor. Inductive probes use the Hall effect for direct current (DC) measurements or current-to-voltage transformers (CVTs) for measuring variable DC or alternating current. Some CVTs can measure impulsive DC depending on their saturation times. Those tools require the probe to surround the wire and are magnetic field based. The sensitivity is relatively poor in comparison to an in-line current measurement. For circuit boards, neither inductive probes nor in-line ammeter measurements are practical to measure current through traces or components because a break needs to be made in the trace. In the case of a wire, such as one leading from a switch, the wire needs to be cut and then spliced/shunted after the measurement. When no power is applied to the circuit this method will not indicate the presence of an electrical connection or continuity because measurement values of 0.0V and 0.0 amps (A) will result for both conditions of broken conductors and of continuity. High input impedance components that have inputs and outputs which are complementary metal-oxide semiconductor (CMOS)-based may not have measurable currents using field equipment because their contact impedances are as high as $10^{12}\Omega$.

As a general rule, for low power or medium power electronic systems the voltage drop where continuity is present will be small. In such cases, a reasonable range is 0.0001 V to 0.1 V across a closed switch, shunt or a circuit segment with good electric continuity and is an indication of a low resistance. The passive voltage method of assessing continuity assumes the circuit is powered. It cannot be used to diagnose unpowered circuits. In addition, the passive voltage method is flawed because it does not address all circuit conditions and can indicate the wrong state of a switch or continuity where there is none. For example, while diagnosing the state of a switch during troubleshooting, an open switch in a circuit with a broken connection, or a switch in series with another open circuit element, the meter will read 0.0 V. Furthermore, an open switch connected to a high impedance component, or metering between two points with similar voltage values, at the time of the measurement will have almost no measurable voltage drop. An example would be an open switch wired to the input of a CMOS-based integrated circuit, or a discrete semi-conductor, and a reasonable voltage range will be between 0.0 V to 0.2 V. Another example would be testing points across two independent electric circuits with separate power sources; a single circuit board may have two separate circuits. All points will read 0 V because there is no potential difference.

All the known methods outlined above result in a burden on the CUT. Using a voltmeter, the effects of voltage sag can be seen when measuring across a circuit element. Most known quality meters and oscilloscopes have input impedances equal to or greater than 10 megaohms (M$\Omega$). An outstanding value is available on a few meters when they are configured to measure within the 1 millivolt (mV) to 1 V scale; for such known test devices, the input impedance can be up to 1 gigaohms (G$\Omega$). Known low quality meters can have input impedance values ranging from 100 kiloohms (k$\Omega$) to 1 M$\Omega$. In-line ammeters also have burden voltage that is calculated by multiplying the meter reading by a specified value. For example, a common known meter used in industrial measurement and testing applications has a burden in the microamp ($\mu$A) scale of 100 $\mu$V and the terminal resistance is 100$\Omega$. An unavoidable additional burden is due to the probe and terminal resistance. In this case, a meter reading of 100 $\mu$A will drop the voltage by 0.01 V. For precision circuits this may be an issue. Burden is much higher when using galvanometers, ohmmeters and continuity check meter modes or equipment. This is because significant voltage sources in series with external resistance is effectively wired into the circuit. For powered sensitive and precision circuits that contain amplifier components such as sensitive gate silicon-controlled rectifiers (SCRs), operational amplifiers, comparators, field effect transistors, and CMOS based integrated circuits, a meter measurement across a broken connection or open switch wired to the input of those types of components can trigger the circuit to change its output state. This can be very undesirable and create a safety hazard. The same can be said for electrical systems with medium power or high power outputs where electrocution is a possibility. In addition, computers and telecommunication equipment may be damaged during such testing using conventional devices and methods.

A very common operator error is the meter probes not being placed in the correct meter terminals to measure resistance, voltage or current. Most known multimeters have up to four terminals which have specific functionality. Fuse integrity is also a common problem and should be checked prior to ammeter usage. Many operators jump back and forth from measuring current and voltage. If proper care is not taken, the operator can accidentally configure the meter to measure current (e.g., mA's or $\mu$A's) while actually taking a voltage measurement. This will most certainly induce a burden and create a short condition, resulting in a blown meter fuse. Any attempt to measure current using the ammeter with a blown fuse will cause a break in an active circuit. The same consequence can occur by having the probes in the voltage terminals and attempting to configure the meter to measure current in-line.

In known circuit test devices and methods, if probes that are not properly connected to the meter or to the circuit element being evaluated for continuity, the meter will yield a false reading. This is a common problem when using automotive single pin type wire piercing probes or telecommunications bed-of-nails probes. There is no way to assess that the probes have continuity with the CUT other than to pair additional probes on a conductor and test continuity between the probes. Therefore, a need exists for circuit test devices, systems and methods that enable users to efficiently overcome the aforementioned problems and issues arising with known test devices and techniques, and that provide a multi-functional platform that is reliable, robust, efficient and easy to use in a variety of operational scenarios encountered in practice in a variety of industries and application environments.

SUMMARY OF THE DISCLOSURE

Embodiments of the disclosure can safely determine if two points in a circuit have electrical continuity or connectivity. This can be achieved by a voltage measurement in combination with logic circuitry and test signal detection under specified conditions. Such a configuration is useful in understanding and assessing a variety of circuit conditions, including whether there is good electrical contact between the probes and circuit, and thereby confirm if there is electrical continuity in the circuit in a reliable and simple process. Practical applications include checking the integrity of wires or the electrical relationships between wires in wire bundles. For explosives operations in particular, a technician can use the disclosed circuit test devices, systems and methods to determine the integrity of firing wires, or the state of switches, or the condition of detonators in both unpowered and powered circuits. Under most test conditions, embodiments of the disclosed circuit test devices, systems and methods can assess that the probes are properly connected without putting two probes at the same contact point. As compared to known test devices and techniques, the disclosed circuit test devices, systems and methods enable users to accomplish relevant testing tasks and obtain accurate results is a shorter timeframe using a single test device. The devices and methods provided herein are simple to use and reliable, which is important during use in the field, where distractions, pressure and time constraints all contribute to an increased risk of user-error for conventional devices and methods.

In a first aspect, the disclosure provides a method. The method includes measuring, by a voltage measurement circuit (VMC), a voltage between a first conductor point and a second conductor point of a CUT. The method includes determining, by logic circuitry, if the measured voltage is less than a low voltage threshold value. The low voltage threshold value is selected so as to indicate electrical continuity between the first and second conductor points. The method includes, in response to determining that the measured voltage is less than the low voltage threshold value: transmitting, by a signal transceiver, a test signal to one of the first and second conductor points; determining, by the logic circuitry, if the test signal is received, by the signal transceiver, after being transmitted. In response to determining that the test signal is received, the method includes reporting, by the logic circuitry, a presence of electrical continuity between the first and second conductor points. Alternatively, in response to determining that the test signal is not received, the method includes reporting, by the logic circuitry, an absence of electrical continuity between the first and second conductor points, or reporting a lack of electrical contact between the VMC and at least one of the first and second conductor points.

In a second aspect, the disclosure provides a circuit. The circuit includes a VMC for measuring a voltage between a first conductor point and a second conductor point of a CUT. The circuit includes a signal transceiver and logic circuitry coupled to: the VMC, and the signal transceiver. The logic circuitry is configured to: determine if the measured voltage is: less than a low voltage threshold value; or greater than a high voltage threshold value; or greater than or equal to the low voltage threshold value and less than or equal to the high voltage threshold value. The low voltage threshold value is selected so as to indicate electrical continuity between the first and second conductor points. The high voltage threshold value is selected so as to indicate an absence of electrical continuity between the first and second conductor points. In response to determining that the measured voltage is less than the low voltage threshold value, the logic circuitry is configured to: transmit, using the signal transceiver, a test signal to one of the first and second conductor points; determine if the test signal is received, using the signal transceiver, after being transmitted. In response to determining that the test signal is received, the logic circuitry is configured to report a presence of electrical continuity between the first and second conductor points. In response to determining that the test signal is not received, the logic circuitry is configured to report: an absence of electrical continuity between the first and second conductor points, or report a lack of electrical contact between the VMC and at least one of the first and second conductor points. In response to determining that the measured voltage is greater than the high voltage threshold value, the logic circuitry is configured to: report the absence of electrical continuity between the first and second conductor points. In response to determining that the measured voltage is greater than or equal to the low voltage threshold value but less than or equal to the high voltage threshold value, the logic circuitry is configured to: transmit, using the signal transceiver, the test signal to the one of the first and second conductor points; determine if the test signal is received, using the signal transceiver, after being transmitted. In response to the test signal being received, the logic circuitry is configured to report the presence of electrical continuity between the first and second conductor points. In response to determining that the test signal is not received, the logic circuitry is configured to report the absence of electrical continuity between the first and second conductor points.

In a third aspect, the disclosure provides a device, including methods of using the device. The device comprises a housing, a power supply disposed within the housing, and an interface positioned on or through a surface of the housing. The interface includes at least two terminals accessible from outside of the housing. The device includes an actuator positioned on or through the surface of the housing and accessible from the outside of the housing. The device includes a circuit disposed within the housing and coupled to: the power supply, the interface, and the actuator. The circuit includes a high input impedance VMC for measuring, via the interface, a voltage between a first conductor point and a second conductor point of a circuit under test. The high input impedance VMC is configured to generate a signal representative of the absolute value of the measured voltage. The circuit includes a signal transceiver and optical sources, such as three optical light sources. The circuit includes logic circuitry coupled to: the high input impedance VMC, the signal transceiver, and the three optical light sources. The logic circuitry is configured to: receive the signal representative of the absolute value of the measured signal; determine, based on the signal representative of the absolute value of the measured signal, if: the absolute value of the measured voltage is less than a low voltage threshold value; or the absolute value of the measured voltage is greater than a high voltage threshold value; or the absolute value of the measured voltage is greater than or equal to the low voltage threshold value but less than or equal to the high voltage threshold value. The low voltage threshold value is selected so as to indicate electrical continuity between the first and second conductor points. The high voltage threshold value is selected so as to indicate an absence of electrical continuity between the first and second conductor points. In response to determining that the absolute value of the measured voltage is less than the low voltage threshold value, the logic circuitry is configured to: cause a first optical light source of the three optical light sources to be energized to transmit light in a first color to the outside of the housing; enable use of the actuator to transmit an initiation signal to the logic circuitry; transmit, via the interface and using the signal transceiver, a test signal to one of the first and second conductor points in response to receiving the initiation signal; and determine if the test signal is received, via the interface and using the signal transceiver, after being transmitted. In response to determining that the test signal is received, the logic circuitry is configured to report a presence of electrical continuity between the first and second conductor points, by causing the first optical light source to be energized to transmit light in the first color to the outside of the housing. In response to determining that the test signal is not received, the logic circuitry is configured to: report the absence of electrical continuity between the first and second conductor points, or report a lack of electrical contact between the two terminals and at least one of the first and second conductor points, by causing a second light source of the three optical light sources to be energized to transmit light in a second color to the outside of the housing. In response to determining that the measured voltage is greater than the high voltage threshold value, the logic circuitry is configured to: disable use of the actuator to transmit the initiation signal to the logic circuitry; and report the absence of electrical continuity between the first and second conductor points, by causing a third optical light source of the three optical light sources to be energized to transmit light in a third color to the outside of the housing. In response to determining that the measured voltage is greater than or equal to the low voltage threshold value and less than or equal to the high voltage threshold value, the logic circuitry is configured to: cause the third optical light source to be energized to transmit light intermittently in the third color to the outside of the housing; enable use of the button to transmit an initiation signal to the logic circuitry; transmit, via the interface and using the signal transceiver, the test signal to the one of the first and second conductor points in response to receiving the initiation signal; and determine if the test signal is received, via the interface and using the signal transceiver, after being transmitted. In response to determining that the test signal is received, the logic circuitry is configured to report the presence of electrical continuity between the first and second conductor points, by causing the first optical light source to be energized to transmit light in the first color to the outside of the housing. In response to determining that the test signal is not received, the logic circuitry is configured to report the absence of electrical continuity between the first and second conductor points, by causing the second light source to be energized to transmit light in a second color to the outside of the housing.

The methods and devices provided herein may further comprise a test block for confirming device functionality by a bump test. The bump test confirms that each of the possible outputs from the device are properly functioning. Accordingly, the test block may be configured to display one of three possible output states selected from the group consisting of: a measured voltage greater than a low voltage threshold; a short between the terminals; and no connection between the terminals. This is an important aspect that can provide confidence to a user that the device is functional properly. When not in use, the test block may be mounted within or to the housing, including generally flush to the housing to minimize obtrusivity without risking loss of the test block when not in use.

Further and alternative aspects and features of the disclosed principles will be appreciated from the following detailed description and the accompanying drawings. As will be appreciated, the principles related to circuit test devices, systems and methods disclosed herein are capable of being carried out in other and different embodiments, and capable of being modified in various respects. Accordingly, it is to be understood that both the foregoing general description and the following detailed description are exemplary and explanatory only and do not restrict the scope of the appended claims.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

As used herein, "low voltage threshold value" refers to a voltage value used to determine whether the CUT has electrical continuity. Accordingly, it is selected depending on the application of interest. For example, the low voltage threshold value may be less than 5V, less than 2V, less than 1V, less than 0.5V or less than 0.1V, including greater than 0V, and any subranges thereof. For example, a preferred low voltage threshold value is between 50 mV and 5 V. For example, in one application the low voltage threshold can be set to 4.9 V. In another exemplary application, the low voltage threshold can be set to 50 mV. In a third exemplary application, the low voltage threshold can be set to 200 mV. Similarly, "high voltage threshold value" refers to a voltage value used to determine whether the CUT does not have electrical continuity. The low and high voltage threshold values may be equal. Preferably, the high voltage threshold value is greater than the low voltage threshold, so that a type of "uncertain" status is provided to the user in the range that falls between the low and high voltage threshold values. For example, the high threshold voltage value may be up to 500%, 400%, 300%, 100%, 50% or up to 10% greater than the low threshold voltage value, such as between 10% and 500%, between 50% and 400%, or about 400%. Alternatively, the high voltage threshold value may be described in terms of an absolute value, such as between 0.1V and 1V, or between 0.5 and 0.9V greater than the low voltage threshold value.

Figure 1A:
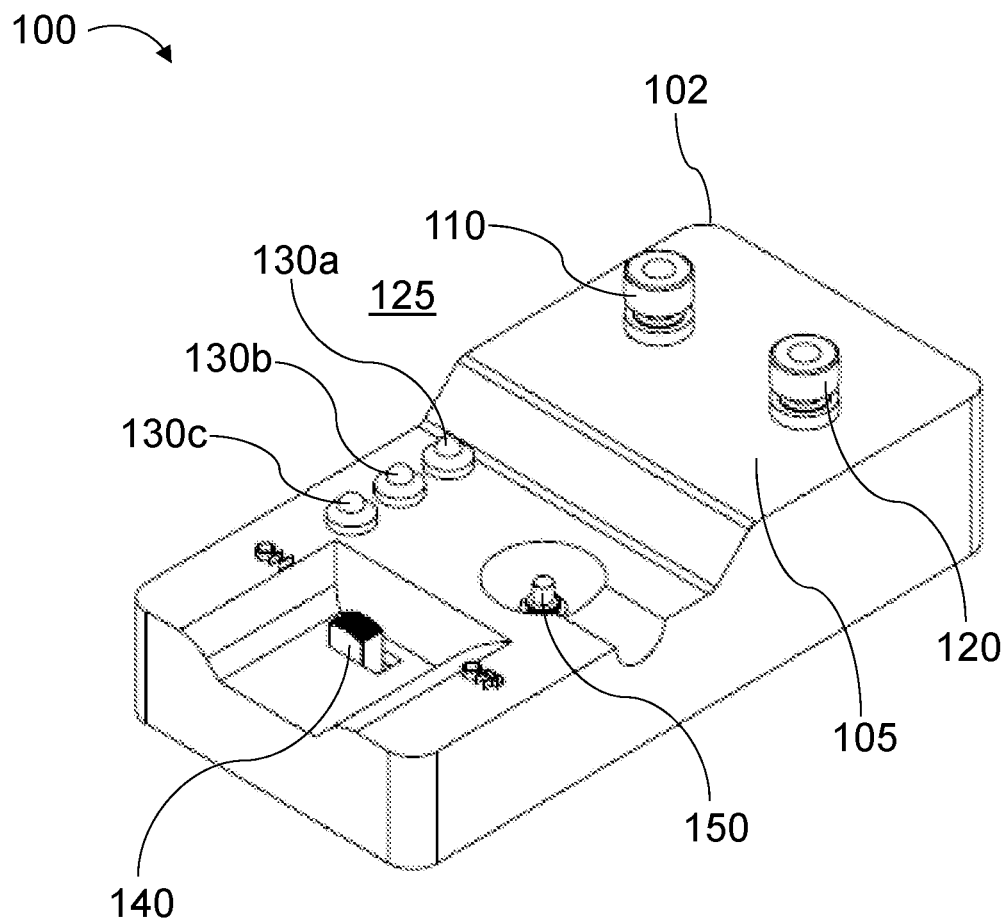
FIG. 1A is a perspective view diagram of a circuit test device according to an embodiment of the disclosure.
Figure 1B:
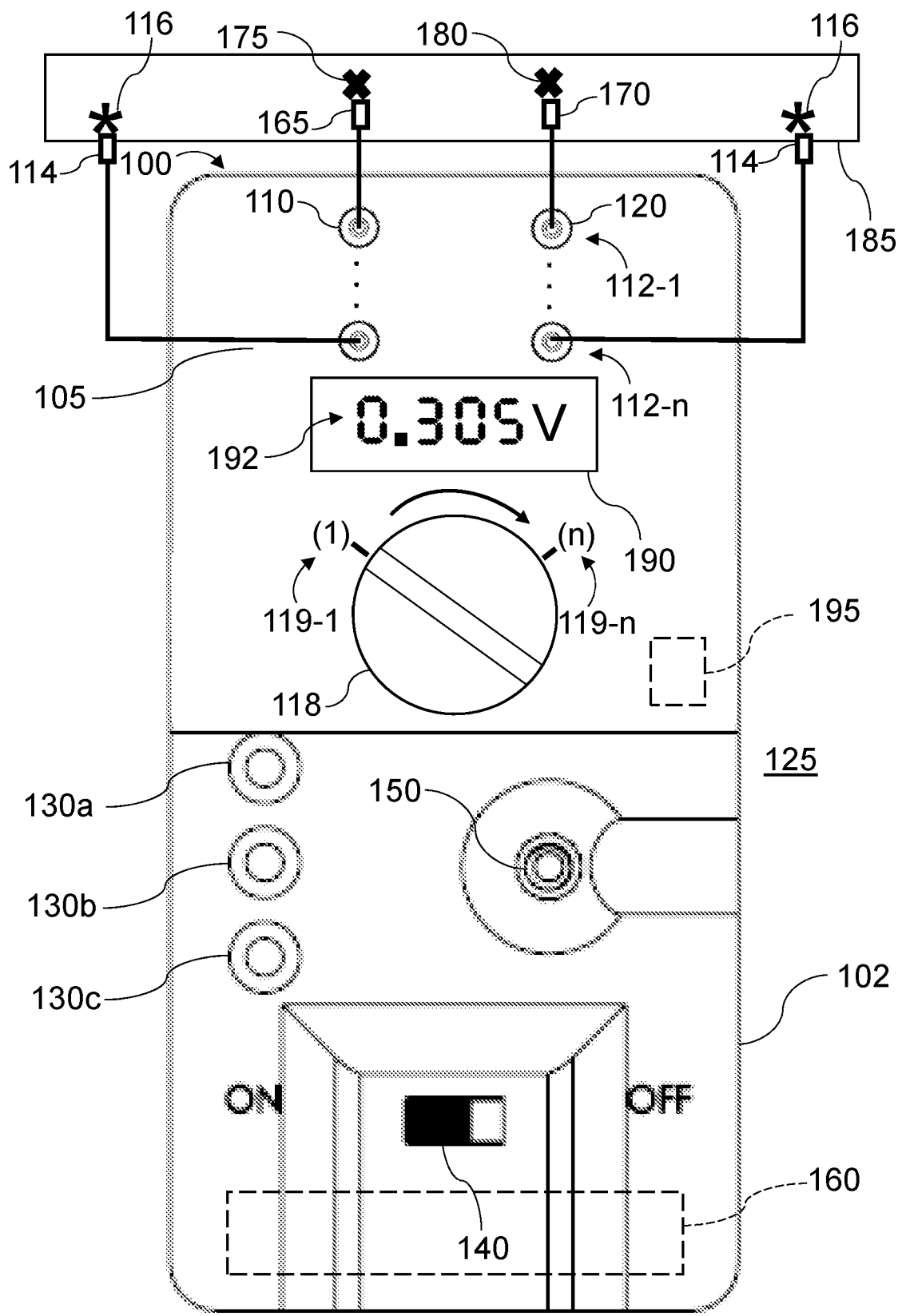
FIG. 1B is a frontal view diagram of the circuit test device according to an embodiment of the disclosure.

FIGS. 1A and 1B are perspective and frontal view diagrams of a circuit test device (100) according to embodiments of the disclosure. The circuit test device (100) (hereinafter referred to as device (100) for brevity) includes a housing (102) and a power supply (160) (e.g., one or more batteries) disposed within an interior cavity of the housing (102). Device (100) includes an interface (105) positioned on or through a surface of the housing (102). The interface (105) includes at least two terminals (e.g., a first 110 and a second 120 terminal) that are accessible from outside (125) of the housing (102). The first (110) and second (120) terminals comprise a first pair (112-1) of terminals. In the example shown in FIG. 1B, the interface (105) includes at least a second pair (e.g., 112-2, . . . , 112-n) of terminals that are accessible from the outside (125) of the housing (102). Device (102) includes an actuator (150) positioned on or through the surface of the housing and accessible from the outside of the housing. In the example device (100) shown in FIGS. 1A and 1B, the actuator (150) is embodied in a push button. In another embodiment, not shown in the figures, actuator (150) is embodied in a switch, such as a toggle switch, or a throw switch, having at least two positions.

Figure 2:
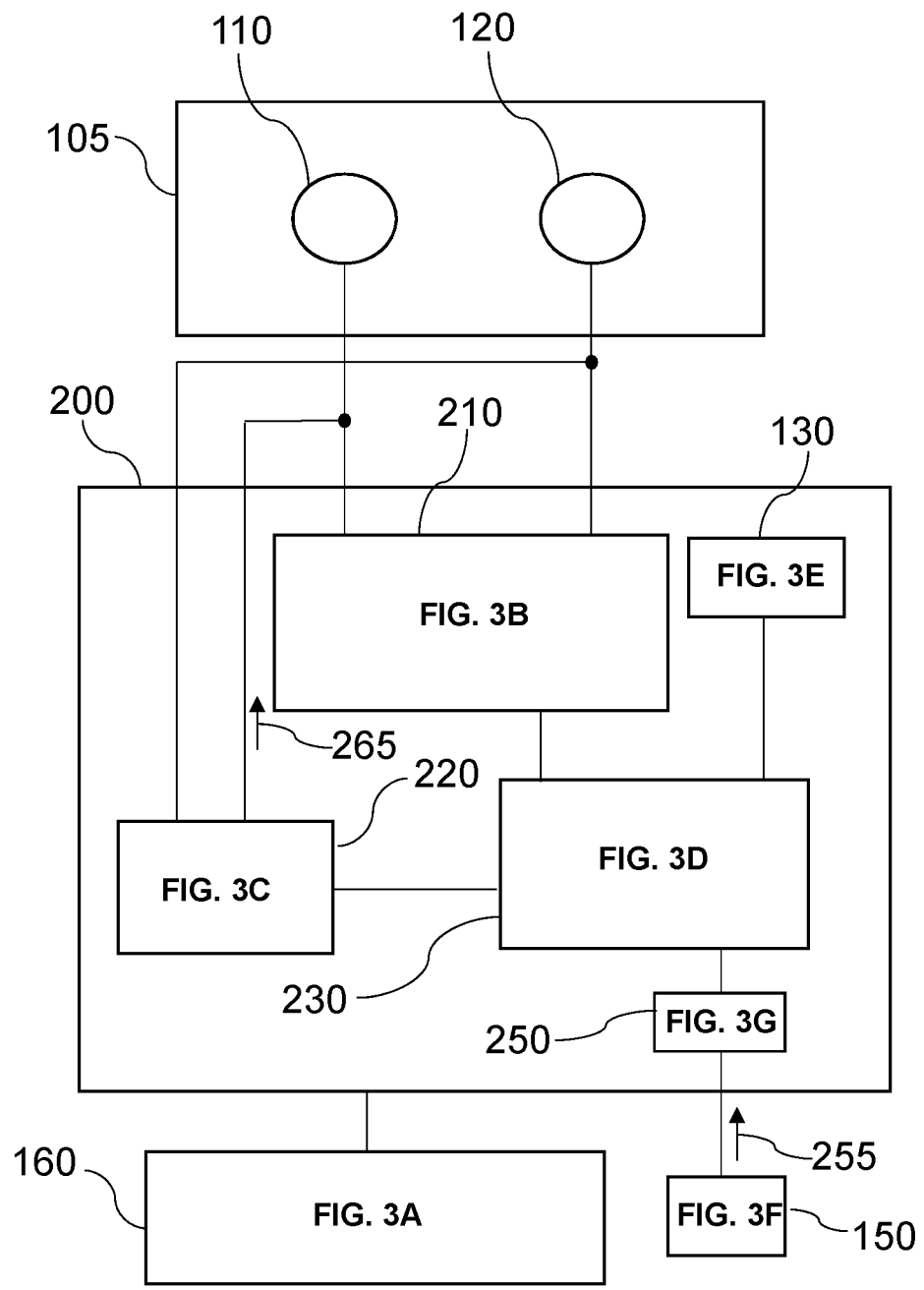
FIG. 2 is a block diagram of a circuit that may be used with the circuit device shown in FIGS. 1A and 1B according to an embodiment of the disclosure.

FIG. 2 is a schematic block diagram of circuit (200) that may be used with the device (100) shown in FIGS. 1A and 1B according to an embodiment of the disclosure. FIGS. 3A-3G are circuit diagrams of aspects of the circuit (200) shown in FIG. 2 according to embodiments of the disclosure (160—FIG. 3A; 210—FIG. 3B; 220—FIG. 3C; 230—FIG. 3D; 130—FIG. 3E; 150—FIG. 3F; 250—FIG. 3G). Circuit (200) is disposed, at least in part, within the interior cavity of the device (100) housing (102), and is electronically coupled to: the power supply (160), the interface (105), and the actuator (150). A master power switch (140) of device (100) accessible from the outside (125) of the device (100) provides a device (100) user the ability to alternately enable and disable a flow of electric current to the circuit (200) for operation of the device (100).

Figure 3A:
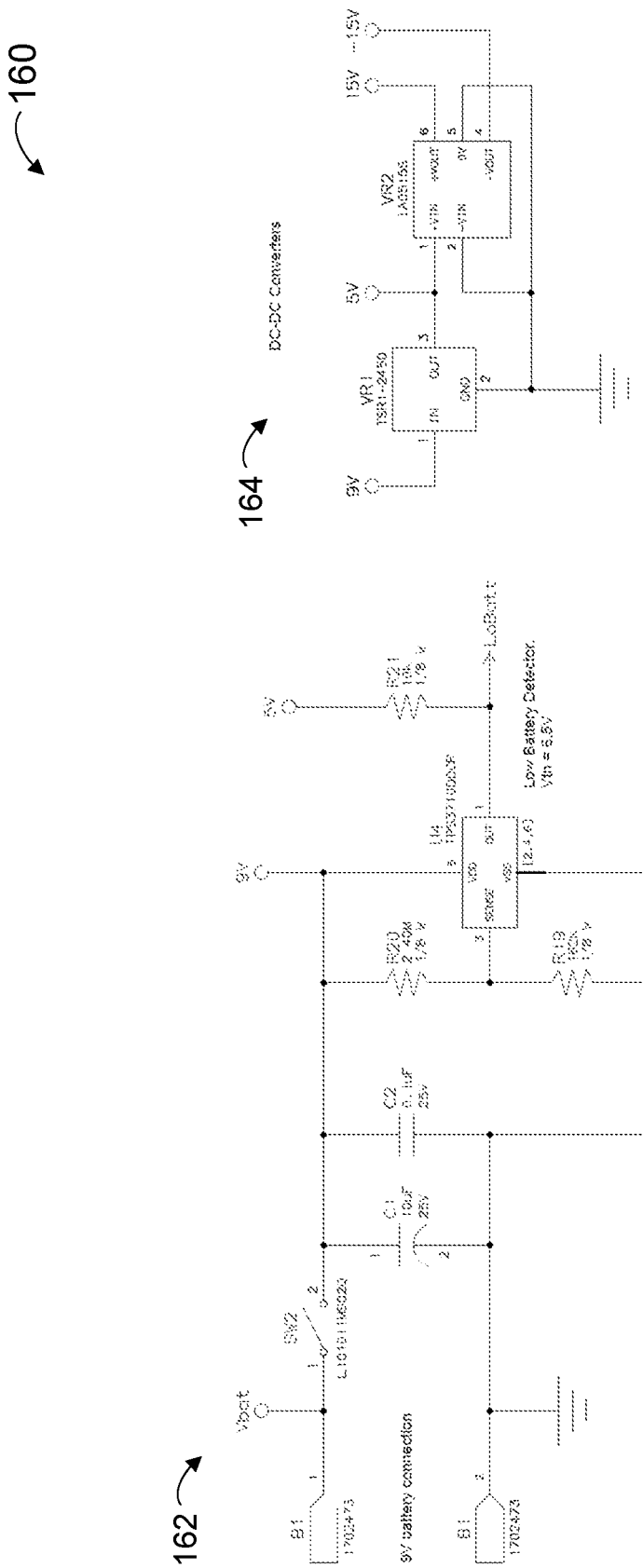
FIGS. 3A-3G are circuit diagrams of aspects of the circuit shown in FIG. 2 according to embodiments of the disclosure.

Referring to FIG. 3A, in one embodiment, the power supply (160) includes power input and conditioning circuitry (162). In the example shown in FIG. 3A, input electrical power to device (100) is provided, with the master power switch (140), labeled as "SW2" in FIG. 3A, by a 9 V battery. In some embodiments, the power input and conditioning circuitry (162) includes a low battery detector that outputs a signal (labeled "LoBatt") in response to the voltage 9V battery decreasing to less than or equal to 6.5 V. This signal may be received and used by logic circuitry (230) to provide an indication to a device (100) user (e.g., a beeping sound and/or a light) to inform the user that battery failure is imminent and the battery should be replaced. The power supply (160) includes one or more DC-to-DC converters that employ conventional voltage regulation and/or components and techniques to provide electric power to other components of device (100) and/or circuit (200) at operating voltages, such as operating voltages of 5 V, 9 V, 15 V and −15 V. Specific labeled identifiers and values for component models, resistances, and capacitances in FIG. 3A are exemplary only. It is to be understood that departures from the labeled identifiers and values in FIG. 3A may be made by persons having ordinary skill in the art to achieve an equivalent, or at least similar function for use in method (400) without departing from either the spirit of the present disclosure, or the scope of the appended claims.

Figure 3B:
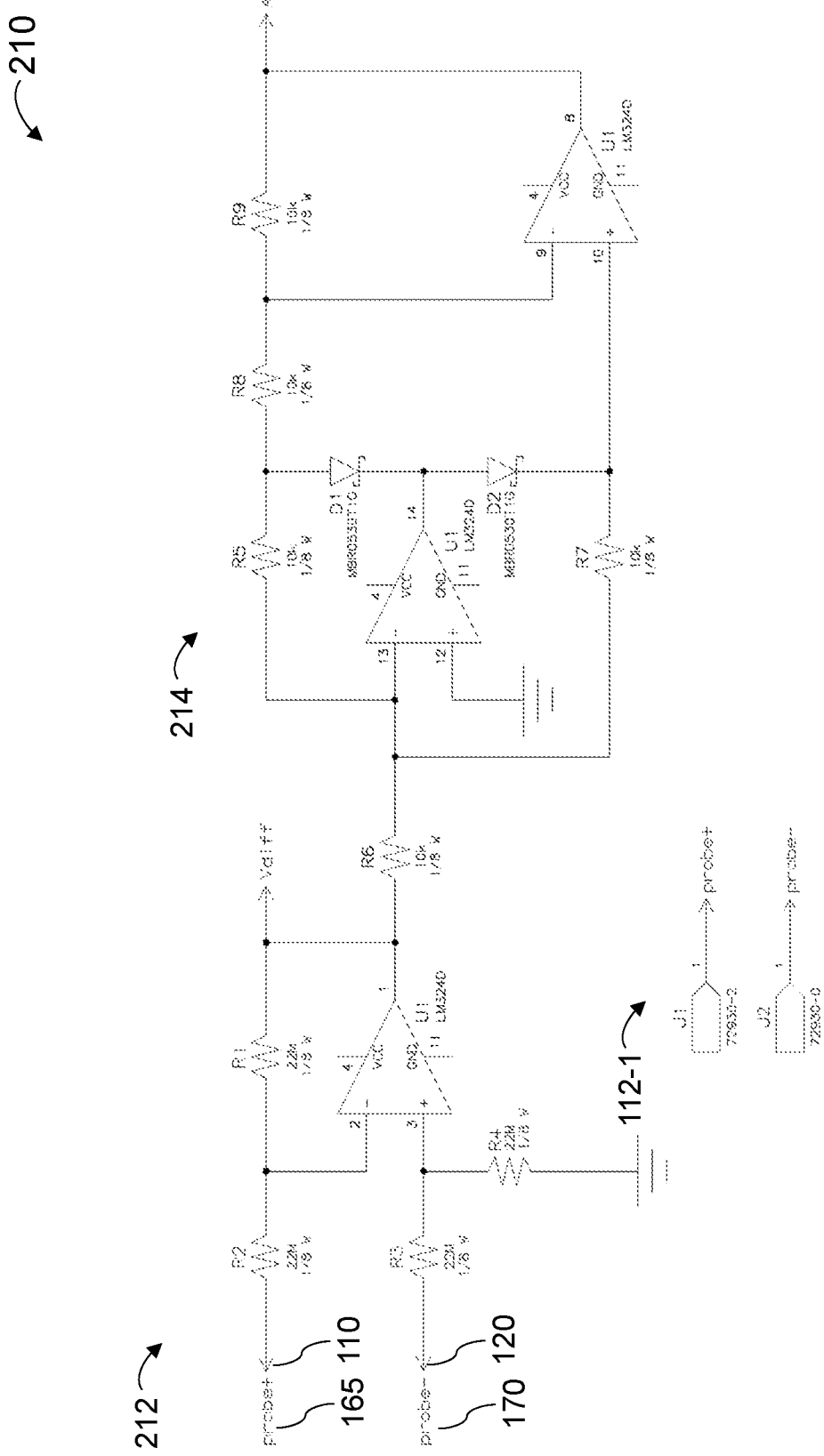

Circuit (200) includes a voltage measurement circuit (VMC) (210) electronically coupled to the terminals (110, 120) of the interface (105). As shown in FIGS. 1B and 3B, by way of the first terminal (110), a first probe (165) may be removably electronically coupled to a first conductor point (175) of a circuit under test (CUT) (185), and a second probe (170) may be removably electronically coupled to a second conductor point (180) of the CUT (185). In those embodiments of device (100) including at least a second pair (e.g., 112-2, . . . , 112-n) of terminals, additional probes (114) may be removably electronically coupled to additional conductor points (116) in the same CUT (185) containing the first (165) and second (170) conductor points and/or in one or more different, or additional, CUT(s), thereby providing the ability to simultaneously assess circuit continuity in a plurality of paired contact points and/or devices.

In the example shown in FIG. 1B, device (100) includes a dial knob (118) that a device (100) user may rotate to select a desired pair of terminals (e.g., 112-1, . . . , 112-n) with which to obtain a measured voltage using VMC (210). For example, the dial knob (118) in a first position (119-1) corresponds to the VMC (210) measuring the voltage by way of the first pair (112-1) of terminals, while the dial knob (118) rotated to at least a second position (e.g., 119-2, . . . , 119-n) corresponds to the VMC (210) measuring the voltage by way of the at least a second pair (e.g., 112-2, . . . , 112-n) of terminals. In another embodiment (not shown), instead of device (100) having the dial knob (118), device (100) includes a toggle or throw switch having at least two positions, and a device (100) may select the desired pair of terminals for measuring voltage using VMC (210) by moving the switch to respectively labeled positions (e.g., 119-1, . . . , 119-n), thereby providing the same, or similar, functionality as described above for the dial knob (118).

In one embodiment, the VMC (210) is embodied in a high input impedance VMC (210) having an input impedance of between 10 MΩ and 1 GΩ, or between 50 MΩ and 100 MΩ, or between 100 MΩ and 200 MΩ, or between 100 MΩ and 1 GΩ, or between 50 MΩ and 1 GΩ.

Referring to FIG. 3B, in one embodiment, the VMC (210) includes a differential voltage circuit (212) and an absolute value circuit (214); for convenience, the terminals (110 120) and probes (135 175) are labeled. The differential voltage circuit (212) is electrically coupled to the pair of terminals (e.g., first pair 112-1) and, with the first pair 112-1 of probes being connected to, for instance, first 175 and second 180 conductor points of the CUT 185, outputs a signal (e.g., labeled "Vdiff" in FIG. 3B) representative of the potential difference between the first 175 and second 180 conductor points. In some embodiments, where, for example, the potential difference between the first 175 and second 180 conductor points is a negative value, it may be desirable for the magnitude of the measured (410) voltage to be utilized in method (400) without regard to its polarity. For this purpose, the absolute value circuit (214) in a follower configuration as shown in FIG. 3B receives an output of the operational amplifier of the differential voltage circuit (212) and outputs a signal representative of the absolute value (e.g., labeled ABS in FIG. 3B) of the measured (410) voltage. Specific labeled identifiers and values for component models and resistances in FIG. 3B are exemplary only. It is to be understood that departures from the labeled identifiers and values in FIG. 3B may be made by persons having ordinary skill in the art to achieve an equivalent, or at least similar function for use in method (400) without departing from either the spirit of the present disclosure, or the scope of the appended claims.

Figure 3C:
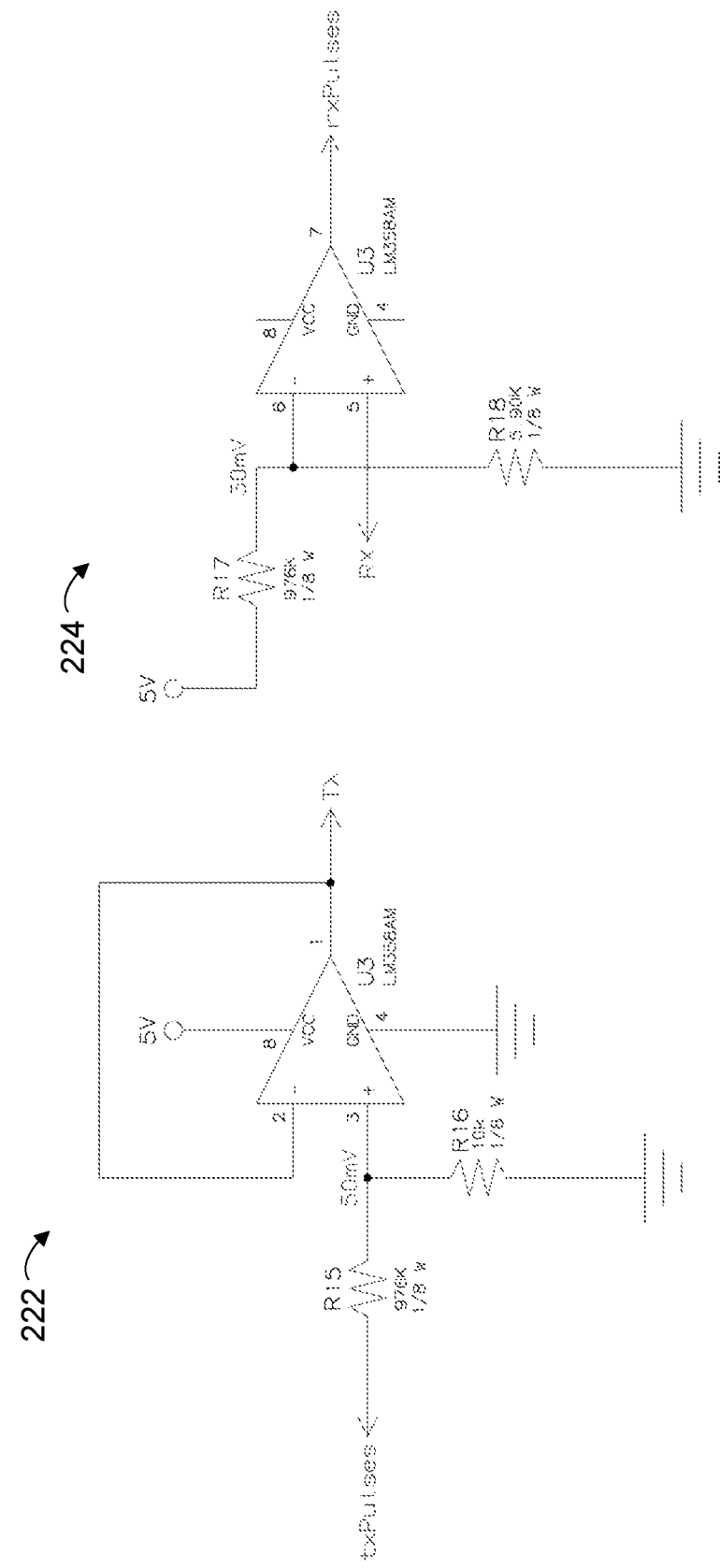

Circuit (200) includes a signal transceiver (220) and at least one optical light source 130 (e.g., light emitting diode(s)). In the embodiment shown in FIGS. 1A and 1B, circuit (200) includes three optical light sources 130 (e.g., a first (130a), a second (130b) and a third (130c) optical light source), such as LEDs (FIG. 3E). Optical light source(s)

Figure 3D:
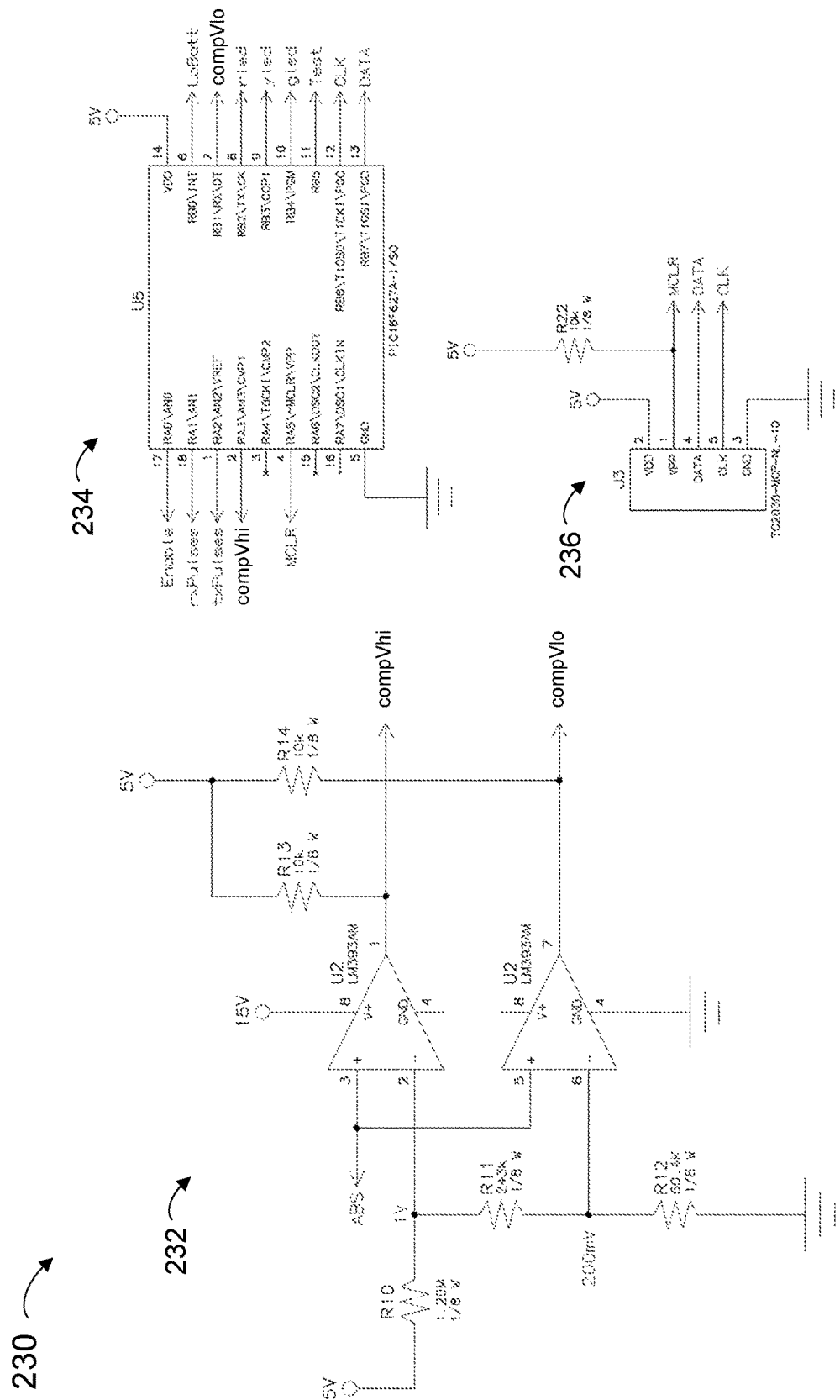
Figure 3E:
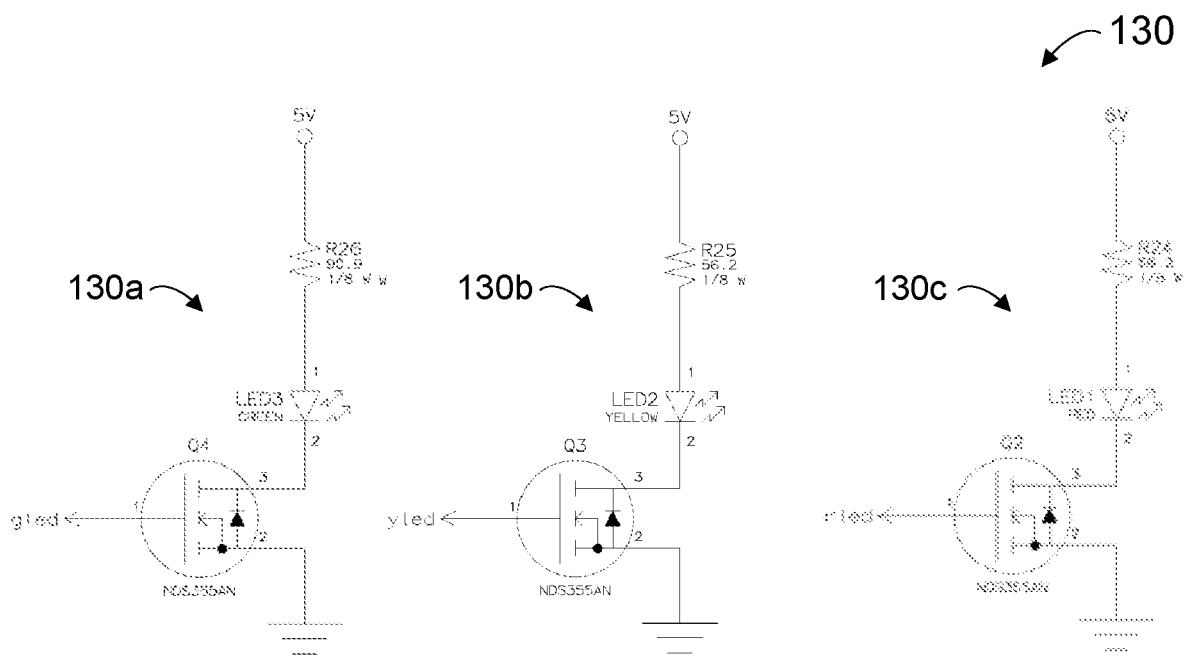

(130) are electronically coupled to the logic circuitry (230) (FIG. 3D). The optical light source(s) 130 are positioned in circuit (200) and disposed within and/or on the housing (102) such that, upon being energized by a flow of electric current, the optical light source(s) (130) transmit light in one or more colors to the outside (125) of the housing (102) where it may be visible to a user of device (100).

Referring to FIG. 3C, in one embodiment, the signal transceiver (220) includes a transmitter circuit (222) and a receiver circuit (224). The transmitter circuit (222) in a follower configuration as shown in FIG. 3C facilitates the transmission (420) of the test signal (265) in method (400) upon receiving a signal (labeled "TxPulses") from logic circuitry (230) (FIG. 3D). The receiver circuit (224) in a classic comparator configuration as shown in FIG. 3C facilitates the determination (425) of whether the test signal (265) is received in method (400) after being transmitted (420) by relaying a signal (labeled "RxPulses") to the logic circuitry (230). Specific labeled identifiers and values for component models and resistances in FIG. 3C are exemplary only. It is to be understood that departures from the labeled identifiers and values in FIG. 3C may be made by persons having ordinary skill in the art to achieve an equivalent, or at least similar function for use in method (400) without departing from either the spirit of the present disclosure, or the scope of the appended claims.

Referring to FIG. 3E, in one embodiment, each or any of the optical light source(s) (130) is energized upon receipt of a control signal from logic circuitry (230). In the illustrated embodiment, the first optical light source (130a) is energized to transmit green light in response to a respective control signal (denoted "gled" in FIG. 3E) being received by a field effect transistor (FET) to enable current to flow from power supply (160) to the first optical light source (130a). Similarly, the second (130b) and third (130c) optical light sources are energized to transmit yellow and red light, respectively, in response to control signals (respectively denoted "yled" and "rled" in FIG. 3E) being received by the respective FETs to enable current to flow from power supply (160) to the second (130b) and third (130c) optical light sources. In the absence of the respective control signal(s) being received by the respective FET(s), the respective optical light source(s) (130) are not energized and thus do not transmit light. Specific labeled identifiers and values for component models and resistances in FIG. 3E are exemplary only. It is to be understood that departures from the labeled identifiers and values in FIG. 3E may be made by persons having ordinary skill in the art to achieve an equivalent, or at least similar function for use in method (400) without departing from either the spirit of the present disclosure, or the scope of the appended claims.

Circuit (200) includes logic circuitry (230) electronically coupled to: the VMC (210), the signal transceiver (220), and the optical light source(s) (130). In the example shown in FIG. 2, circuit (200) includes an electronic isolation device (EID) (250) providing a means for selectively electronically isolating the actuator (150) from the logic circuitry (230). In one embodiment, the EID (250) is or includes a relay. In another embodiment, the EID (250) is or includes an optocoupler (e.g., optoisolator). In yet another embodiment, the EID (250) is or includes a galvanic (e.g., transformer) EID. In still another embodiment, the EID (250) is or includes a transistor and isolated transistor gate driver. In another embodiment, the EID (250) is or includes a digital isolation device or system. In yet another embodiment, the EID (250) is or includes an integrated circuit device(s) and/or application specific integrated circuit(s) for providing electronic isolation between the actuator (150) and the logic circuitry (230). As the logic circuitry (230) is directly or indirectly electronically coupled to optical light source(s) (130), VMC (210), signal transceiver (220), power supply (160), and terminals (110, 120), the EID (250) further provides a means for selectively electronically isolating the actuator (150) from the optical light source(s) (130), VMC (210), signal transceiver (220), power supply (160), and terminals (110, 120).

Referring to FIG. 3D, in one embodiment, the logic circuitry (230) includes a test voltage threshold circuit (232) and a controller (234). In the example shown in FIG. 3D, the controller (234) is a programmable microcontroller (e.g., P1C16F627) including, or coupled to, a memory device (not shown) having software and/or firmware stored thereon for executing one or more of the steps of method (400) (e.g., determining (425) step) as disclosed herein. In embodiments where the controller (234) is a microcontroller or microprocessor, logic circuitry (230) includes a clock circuit (236). Additionally, or instead, the microcontroller or microprocessor has the required clock functionality integrated therein in the same controller (234) component. In other embodiments, the controller (234) is embodied in an application-specific integrated circuit that does not require integral, or attached, memory and/or clocking functionality for use in method (400).

In the example shown in FIG. 3D, the test voltage threshold circuit (232) in a window comparator configuration receives the signal representative of the absolute value of the measured (410) voltage (labeled "ABS" in FIGS. 3B and 3D). In the case where the absolute value of the measured (410) voltage is less than the low voltage threshold value, a first output signal (denoted "compVlo" in FIG. 3D) is provided by the test voltage threshold circuit (232) to controller (234) to facilitate the determination (415) in method (400) that the measured (410) voltage is less than the low voltage threshold value. Where the absolute value of the measured (410) voltage is greater than the high voltage threshold value, a second output signal (denoted "compVhi" in FIG. 3D) is provided by the test voltage threshold circuit (232) to controller (234) to facilitate the determination in method (400) that the measured (410) voltage is greater than the high voltage threshold value. Where the absolute value of the measured (410) voltage is greater than or equal to the low voltage threshold value and less than or equal to the high voltage threshold value, no signal is provided by the test voltage threshold circuit (232) to controller (234) to facilitate the determination in method (400) that the measured (410) voltage is greater than or equal to the low voltage threshold value and less than or equal to the high voltage threshold value.

In one embodiment, the low voltage threshold value for which the test voltage threshold circuit (232) provides the aforementioned first signal (e.g., "compVlo") to the controller (234) is between 0 V and 1 V, may be less than 5 V, less than 1 V, less than 0.5 V, or less than 0.1 V, and any subranges thereof, such as between 0 V and 0.5 V. In one embodiment, the high voltage threshold value for which the test voltage threshold circuit (232) provides the aforementioned second signal (e.g., "compVhi") to the controller (234) is between 0.1 V and 1 V greater than the low voltage threshold, or between 5% and 500% greater than the low voltage threshold, or between 0.1 V and 0.5 V greater than the low threshold value. Specific labeled identifiers and values for component models and resistances in the figures, including in FIG. 3D, are exemplary only. It is to be understood that departures from the labeled identifiers and values in the figures, including in FIG. 3D, may be made by persons having ordinary skill in the art to achieve an equivalent, or at least similar function for use in method (400) without departing from either the spirit of the present disclosure, or the scope of the appended claims.

Figure 3F:
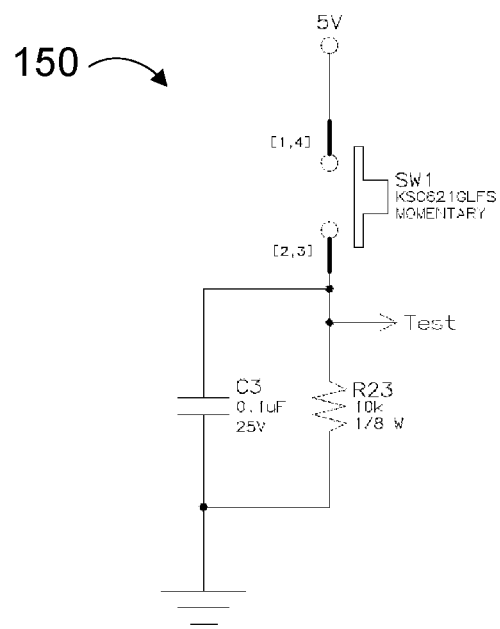
Figure 3G:
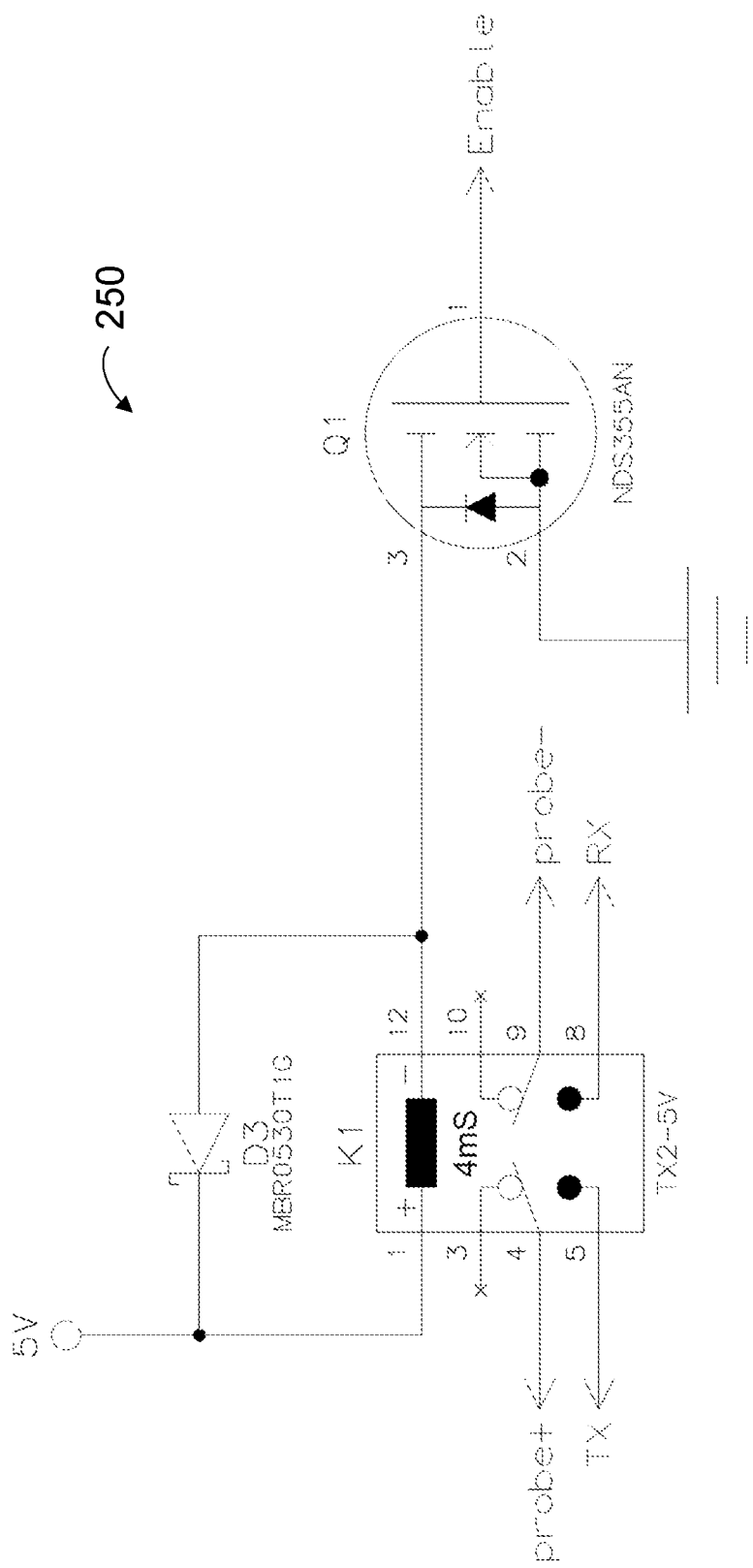

Referring to FIGS. 3F and 3G, in one embodiment, the actuator (150) (e.g., push button) is functional for implementing the transmitting (420) step in method (400) only at such times when EID (250) (e.g., relay) is in receipt of an "enable" signal from the logic circuitry (230). In one embodiment, logic circuitry (230) (e.g., controller (234)) transmits the enable signal to EID (250) in response to the measured (410) voltage being determined (415) to be less than the low voltage threshold value. In another embodiment, logic circuitry (230) (e.g., controller (234)) transmits the enable signal to EID (250) either in response to the measured (410) voltage being determined (415) to be greater than or equal to the low voltage threshold value but less than or equal to the high voltage threshold value. The EID (250) thereby provides electronic isolation between the actuator (150) and the logic circuitry (230) as a safety precaution in performance of method (400) for certain operational scenarios, as described in greater detail below. In yet another embodiment, the device (100) and/or circuit (200) includes a switch (not shown in the figures) that allows a user to selectively and alternately electronically couple/decouple the EID (250) to/from the actuator (150). In such embodiments, with the EID (250) decoupled from the actuator (150), the user may operate the actuator (150) to cause the transmitting (420) step to be performed in method (400) in any of the three cases for the measured (410) voltage, namely: less than the low voltage threshold value, greater than the high voltage threshold value, and/or greater than or equal to the low voltage threshold value but less than or equal to the high voltage threshold value. However, for applications of the disclosed device (100), circuit (200), and/or method (400) such as explosive ordinance disposal (EOD), transmitting (420) the test pulse (165) when the measured (410) voltage is determined (415) to be greater than the high voltage threshold value and, in some cases, greater than or equal to the low voltage threshold value but less than or equal to the high voltage threshold value, presents a safety concern for the device (100) and/or circuit (200) user, as well as for bystanders. In such applications, transmitting (420) the test signal (265) risks triggering an explosion. For less sensitive applications that do not call for the heightened safety precautions of, for instance, EOD, transmitting (420) the test signal (265) can be useful in the circuit analysis using, for example, the disclosed device (100), circuit (200) and method (400). If the transmitted (420) test signal (420) is received, it definitively establishes that there is resistive load between the first (175) and second (180) conductor points. For purposes of this disclosure, a high resistance is defined as a load between the two points in the circuit having a resistance of from 1 kΩ to 1 MΩ. On the other hand, if the test signal (265) is not received after it is transmitted (420), then there is definitively an absence of electrical continuity between the two conductor points (175 and 180).

Specific labeled identifiers and values for component models and resistances in FIGS. 3A-3G are exemplary only. It is to be understood that departures from the labeled identifiers and values in FIGS. 3A-3G may be made by persons having ordinary skill in the art to achieve equivalent, or at least similar functionality for use in method (400) without departing from either the spirit of the present disclosure, or the scope of the appended claims.

Figure 4:
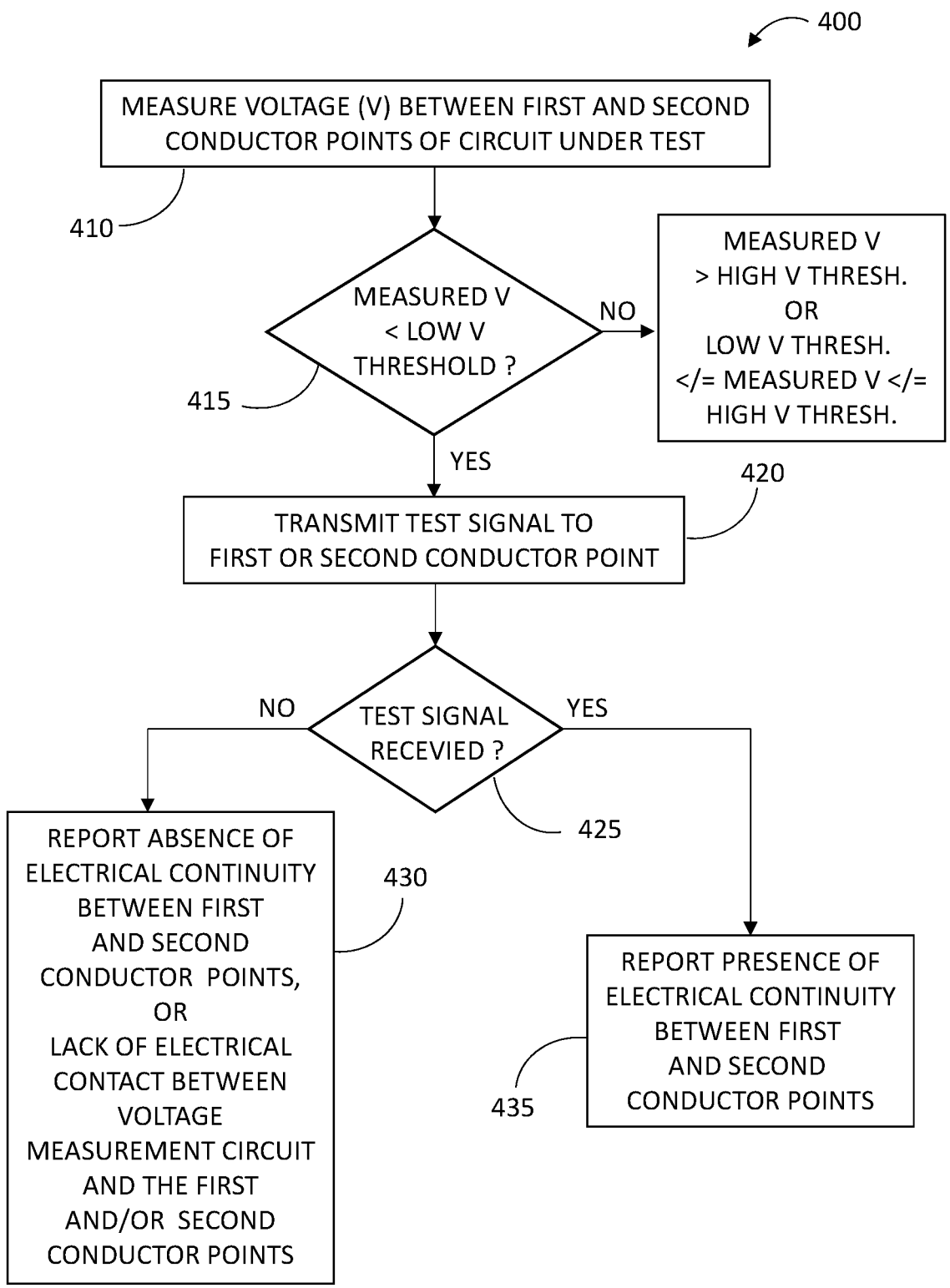
FIG. 4 is a flow chart of a method for testing a circuit according to an embodiment of the disclosure.

FIG. 4 is a flow chart of a method (100) for testing a circuit according to an embodiment of the disclosure. As performed, implemented and/or otherwise facilitated by the disclosed device (100) and/or circuit (200), method (400) may be advantageously utilized in diverse industries and application environments where circuit (including wire) testing requiring reliable, accurate and robust measurement and automated control mechanisms that are verifiable by device users are beneficial for safety, efficiency and effectiveness considerations, among others. Such industries and application environment include, for example and without limitation, telecommunications, facilities engineering, civil engineering, geology, mining, construction, explosives demolition, military, law enforcement, and blasting. Method (100) may be implemented, performed, and/or otherwise facilitated, at least in part, using the device (100) and/or the circuit (200) shown and described above with reference to FIGS. 1A, 1B, 2, 3A-3G. Referring to the foregoing figures and the description thereof, method (400) includes measuring (410) a voltage between the first conductor point (175) and the second conductor point (180) of the CUT (185). In embodiments where the measuring (410) step of method (100) is implemented by device (100) and/or circuit (200), the voltage between the first (175) and second (180) conductor points is measured (410) using the VMC (210). In some embodiments, the VMC (210) embodied in the high input impedance VMC is used for the measuring (410) of method (400). In the disclosed embodiments, the measured (410) voltage advantageously dictates the remaining processes to be performed in method (400) implemented, for example, using device (100) and/or circuit (200), according to the disclosed embodiments.

Method (400) includes determining (415) if the measured (410) voltage is less than a low voltage threshold value. In embodiments where the determining (415) step of method (100) is implemented by device (100) and/or circuit (200), the logic circuitry (230) determines (415) if the measured (410) voltage is less than a low voltage threshold value based on signal(s) representative of the measured (410) voltage that is/are received from VMC (210). The low voltage threshold value is selected so as to indicate electrical continuity between the first (175) and second (180) conductor points. In some embodiments, the VMC (210) provides an absolute value of the measured (410) voltage and the logic circuitry (230) determines (415) if an absolute value of the measured (410) voltage is less than the low voltage threshold value, thereby making irrelevant the relative positions of the probe placements with respect to each other. In one embodiment, in response to determining (415) that the measured (410) is less than the low voltage threshold value, logic circuitry (230) causes one of the optical light source(s) 130 (e.g., first optical light source 130a) to be energized to transmit light in a first color (e.g., green) to the outside (125) of device (100). In the embodiment, the transmission of light by the optical light source (130) in the first color indicates (e.g., to a device (100) user) that the measured (410) voltage is less than the low voltage threshold value in method (400).

In response to determining (415), e.g., by the logic circuitry (230), that the measured voltage is less than the low voltage threshold value, method (400) includes transmitting (420) a test signal (265) to the first (175) or the second (180) conductor points. For example, upon the logic circuitry (230) determining (415) that the measured (410) voltage is less than the low voltage threshold value, the logic circuitry (230) causes the signal transceiver (220) to transmit (420) the test signal (265) to the first conductor point (175) by way of the first probe (175) electronically coupled to the first conductor point (175). In one embodiment, a voltage amplitude (and/or magnitude) or a current amplitude (and/or magnitude) of the test signal (265) is less than or equal to a tenth of a no-fire condition of the CUT, thereby providing added safety precautions in method (400) when testing CUTs that are known, or suspected, to include electric detonator devices. In one embodiment, the voltage amplitude of the test signal (265) is between 20 mV and 100 mV. In another embodiment, the voltage amplitude of the test signal (265) is between 100 mV and 200 mV. In yet another embodiment, the voltage amplitude of the test signal (265) is between 10 mV and 50 mV. In still another embodiment, the voltage amplitude of the test signal (265) is between 10 mV and 500 mV. In one embodiment, the current amplitude of the test signal (265) is between 0.1 µA and 100 mA. In another embodiment, the current amplitude of the test signal (265) is between 10 µA and 1 mA. In yet another embodiment, the current amplitude of the test signal (265) is between 1 mA and 20 mA. In still another embodiment, the current amplitude of the test signal (265) is between 1 mA and 100 mA.

Accordingly, the step of transmitting the test signal may comprise transmitting the test signal to the first conductor point using a first probe connected to the first conductor point. Similarly, the step of determining if the test signal is received may comprise determining if the test signal is received via a second probe connected to the second conductor point.

Method (400) includes determining (425) if the test signal (265) is received by the signal transceiver (220) after the test signal (265) is transmitted (420). In the disclosed embodiments, whether or not, e.g., as determined (425) by the logic circuitry (230), the test signal (265) is received by the signal transceiver (220) after being transmitted (420) advantageously dictates the remaining processes to be performed in method (400) implemented, for example, using device (100) and/or circuit (200), according to the disclosed embodiments. In one embodiment, the transmitting (425) step of method (400) includes transmitting (425) the test signal (265) to the first conductor point (175) using the first probe (175) electrically connected to the first conductor point (175). In the embodiment, the determining (425) step of method (400) includes determining (425) if the test signal (265) is received via the second probe (170) connected to the second conductor point (180). In particular, where after the logic circuitry (230) causes the test signal (265) to be transmitted (425) by the signal transceiver (220) via the first probe (165), receipt of the test signal (265) by signal transceiver (220) (e.g., via the second probe (170)) requires electrical continuity between the first (175) and second (180) conductor points. In one embodiment, in response to determining (425) that the test signal (265) is received, logic circuitry (230) causes one of the optical light source(s) 130 (e.g., first optical light source 130a) to be energized to transmit light in the first color (e.g., green) to the outside (125) of device (100). In the embodiment, the transmission of light by the optical light source (130) in the first color indicates (e.g., to a device (100) user) the presence of electrical continuity between the first (175) and second (180) conductor points in method (400). In another embodiment, in response to both determining (415) that the measured (410) voltage is less than the low voltage threshold value and determining (425) that the test signal (265) is received, logic circuitry (230) causes one of the optical light source(s) 130 (e.g., first optical light source 130a) to be energized to transmit light in the first color (e.g., green) to the outside (125) of device (100). In this embodiment, the transmission of light by the optical light source (130) in the first color indicates (e.g., to a device (100) user) both the measured (410) being less than the low voltage threshold value and the presence of electrical continuity between the first (175) and second (180) conductor points in method (400).

On the other hand, where the test signal (265) is not received after being transmitted (425) in method (400), either there is no electrical continuity between the first (175) and second (180) conductor points, or there is insufficient electrical contact between VMC (210) and the first (175) and/or second (180) conductor points, e.g., via first (165) and/or second (170) probes. In response to determining (425) that the test signal (265) is not received, method (400) includes reporting (430): an absence of electrical continuity between the first (175) and second (180) conductor points, or a lack of electrical contact between the VMC (210) and at least one of the first (175) and second (180) conductor points. In one embodiment, in response to both determining (415) that the measured (410) voltage is less than the low voltage threshold value and determining (425) that the test signal (265) is not received, logic circuitry (230) causes one of the optical light source(s) 130 (e.g., second optical light source 130b) to be energized to transmit light in a second color (e.g., yellow) to the outside (125) of device (100). In the embodiment, the transmission of light by the optical light source (130) in the second color indicates (e.g., to a device (100) user) the absence of electrical continuity between the first (175) and second (180) conductor points, or the lack of electrical contact between the VMC (210) and the first (175) and/or second (180) conductor points, in method (400). Confirming electrical contact of the VMC (210) with the first (175) and second (180) conductor points may include a user of device (100) and/or circuit (200) visually and/or manually inspecting the first (165) and/or second (170) probes with respect to their being adequately electrically coupled to the first (175) and/or second (180) conductor points of the CUT (185). For this confirming, an appropriately trained device (100) user may use his or her judgment and expertise to decide that a different type of probe or combination of probes should be substituted for presently utilized probes (e.g., 165 and/or 170) in method (100). The user would put a new probe adjacent to both the first (165) and/or second (170) probes creating two probe pairs. The VMC would read zero when each pair of probes is treated as a new set of first (175) and/or second (180) conductor points of a CUT (185). Using the embodiments above, the transmission and receipt of the signal and the transmission of the first light source (130a) would confirm the original probes were adequately connected to the CUT (185) and therefore confirm the CUT did not have continuity. If the signal was not received on one or both of the pairs and the second light source (130b) was illuminated, this would confirm the lack of electrical contact between the VMC (210) and the first (175) and/or second (180) conductor points, in method (400). As stated above, the steps of analyzing the CUT would be repeated using the second set of probes.

A second course of action in method (400) that is dictated by the measured (410) voltage is the case where the measured (410) voltage is greater than or equal to the low voltage threshold value but less than or equal to a high voltage threshold value ($V_{low} \leq V_{meas} \leq V_{high}$). The high voltage threshold value is greater than the low voltage threshold value and is selected so as to indicate an absence of electrical continuity between the first (175) and second (180) conductor points. In an embodiment, method (400) includes determining if the measured (410) voltage is greater than or equal to the low voltage threshold value but less than or equal to a high voltage threshold value. In embodiments where this determining step of method (100) is implemented by device (100) and/or circuit (200), the logic circuitry (230) determines (415) if the measured (410) voltage is greater than or equal to the low voltage threshold value but less than or equal to a high voltage threshold value based on signal(s) representative of the measured (410) voltage that is/are received from VMC (210). In embodiments where the VMC (210) provides the absolute value of the measured (410) voltage, the logic circuitry (230) determines (415) if an absolute value of the measured (410) voltage is greater than or equal to the low voltage threshold value but less than or equal to the high voltage threshold value. In one embodiment, in response to both determining (415) that the measured (410) voltage is greater than or equal to the low voltage threshold but less than or equal to the high voltage threshold, logic circuitry (230) causes one of the optical light source(s) 130 (e.g., third optical light source 130c) to be energized to intermittently flash in the third color (e.g., red) to the outside (125) of device (100). In the embodiment, the intermittent transmission (e.g., flashing) of light by the optical light source (130) in the third color indicates (e.g., to a device (100) user) the measured (410) voltage being greater than or equal to the low voltage threshold but less than or equal to the high voltage threshold in method (400).

In response to determining that the measured (410) voltage is greater than or equal to the low voltage threshold value but less than or equal to the high voltage threshold value, method (400), in an embodiment, the confirming step of method (400) includes: transmitting (420), e.g., by the signal transceiver (220), the test signal (265) to the one of the first (175) and second (180) conductor points, and determining (425), e.g., by the logic circuitry (230), if the test signal (265) is received, by the signal transceiver (220), after being transmitted (420), as described in greater detail above. In response to determining (425) that the test signal (265) is received, method (400) includes reporting (435), e.g., by the logic circuitry (230), the presence of electrical continuity between the first (175) and second (180) conductor points. In this case, the reporting (430) step of method (400) may include reporting, e.g., by the logic circuitry (230), a presence of a small resistive load between the first (175) and second (180) conductor points.

In one embodiment, in response to determining (425) that the test signal (265) is received, logic circuitry (230) reports (435) the presence of the electrical continuity between the first (175) and second (180) conductor points by causing one of the optical light sources (130) (e.g., first optical light source 130a) to be energized to transmit light in the first color (e.g., green) to the outside (125) of device (100). In the embodiment, the transmission of light by the optical light source (130) in the first color indicates (e.g., to a device (100) user) the presence of electrical continuity between the first (175) and second (180) conductor points. In another embodiment, in response to both determining (415) that the measured (410) voltage is greater than or equal to the low voltage threshold but less than or equal to the high voltage threshold and determining (425) that the test signal (265) is received, logic circuitry (230) causes one of the optical light source(s) 130 (e.g., first optical light source 130a) to be energized to transmit light in the first color (e.g., green) to the outside (125) of device (100). In this embodiment, the transmission of light by the optical light source (130) in the first color indicates (e.g., to a device (100) user) both that the measured (410) voltage is greater than or equal to the low voltage threshold but less than or equal to the high voltage threshold, and the presence of electrical continuity between the first (175) and second (180) conductor points, in method (400).

The fact that a voltage is measured confirms that the probes are electrically connected to the first and second conductor points in the CUT. In response to determining (425) that the test signal (265) is not received, method (400) includes reporting (430), e.g., by the logic circuitry (230), the absence of electrical continuity between the first (175) and second (180) conductor points. In one embodiment, in response to determining (425) that the test signal (265) is not received, logic circuitry (230) reports (435) the absence of the electrical continuity between the first (175) and second (180) conductor points by causing one of the optical light sources (130) (e.g., second optical light source 130b) to be energized to transmit light in the second color (e.g., yellow) to the outside (125) of device (100). In the embodiment, the transmission of light by the optical light source (130) in the second color indicates (e.g., to a device (100) user) the absence of electrical continuity between the first (175) and second (180) conductor points. In another embodiment, in response to both determining (415) that the measured (410) voltage is greater than or equal to the low voltage threshold but less than or equal to the high voltage threshold and determining (425) that the test signal (265) is not received, logic circuitry (230) causes one of the optical light source(s) 130 (e.g., second optical light source 130b) to be energized to transmit light in the second color (e.g., yellow) to the outside (125) of device (100). In this embodiment, the transmission of light by the optical light source (130) in the second color indicates (e.g., to a device (100) user) both that the measured (410) voltage is greater than or equal to the low voltage threshold but less than or equal to the high voltage threshold, and the absence of electrical continuity between the first (175) and second (180) conductor points, in method (400).

A third course of action in method (400) that is dictated by the measured (410) voltage is the case where the measured (410) voltage is greater than the high voltage threshold value. In an embodiment, method (400) includes determining, e.g., by the logic circuitry (230), if the measured (410) voltage is greater than the high voltage threshold value. In embodiments where this determining step of method (100) is implemented by device (100) and/or circuit (200), the logic circuitry (230) determines (415) if the measured (410) voltage is greater than the high voltage threshold value based on signal(s) representative of the measured (410) voltage that is/are received from VMC (210). In embodiments where the VMC (210) provides the absolute value of the measured (410) voltage, the logic circuitry (230) determines (415) if an absolute value of the measured (410) voltage is greater than the high voltage threshold value. In the embodiment, in response to determining that the measured (410) voltage is greater than the high voltage threshold value, method (400) includes the fact that a voltage is measured confirms electrical contact of the VMC (210) (e.g., probes) with the first (175) and second (180) conductor points (which may include the user-performed visual and/or manual checks of the probe(s) (e.g., 165 and/or 170, as described above)), and reporting, e.g., by the logic circuitry (230): a presence of a high resistance between the first (175) and second (180) conductor points, or the absence of electrical continuity between the first (175) and second (180) conductor points. In one embodiment, in response to determining (415) that the measured (410) voltage is greater than the high voltage threshold value, logic circuitry (230) causes one of the optical light source(s) 130 (e.g., third optical light source 130c) to be energized to transmit light in a third color (e.g., red) to the outside (125) of device (100). In the embodiment, the transmission of light by the optical light source (130) in the third color indicates (e.g., to a device (100) user) the absence of electrical continuity between the first (175) and second (180) conductor points in method (400).

For use in method (400), the disclosed device (100) and/or circuit (200) may include a variety of useful features for reporting the measured (410) voltage, the presence and/or absence of electrical continuity between the first (175) and second (180) conductor points, and the lack of electrical contact between the VMC (210) and at least one of the first (175) and second (180) conductor points. In an embodiment, method (400) includes reporting, e.g., by the logic circuitry (230), the measured (410) voltage relative to the low voltage threshold value. In the example shown in FIG. 1B, device (100) and/or circuit (200) includes a means for transmitting a respective maximum measured (410) voltage value or a respective range of measured (410) voltage values to a user of the device (100) and/or circuit (200). The means for transmitting a respective maximum measured (410) voltage value or a respective range of measured (410) voltage values is electronically coupled to logic circuitry (230), and the logic circuitry (230) is configured to report the measured (410) voltage using the transmitting means.

In one embodiment, the optical light source(s) (130) provide(s) the means for transmitting the respective maximum measured (410) voltage value or the respective range of measured (410) voltage values. In the embodiment, reporting (430, 435) the measured (410) voltage in method (400) includes causing, e.g., by the logic circuitry (230) the optical light source(s) (130) to be energized. When the optical light source(s) (130) are so energized, the optical light source(s) (130) transmit light in a color corresponding to the respective maximum measured (410) voltage value or the respective range of measured (410) voltage values. Thus, as described in further detail above, in those cases where the measured (420) voltage is greater than the high voltage threshold value, for example, the logic circuitry (230) causes the at least one optical light source (130) to be energized to transmit light in the third color (e.g., red). In an embodiment, reporting (430) the presence of electrical continuity and/or reporting (435) the absence of electrical continuity, between the first (175) and second (180) conductor points includes causing the optical light source(s) (130) to be energized. When the optical light source(s) (130) are so energized, the optical light source(s) (130) transmit light in a color corresponding to the presence, or the absence, of electrical continuity. Thus, as described in further detail above, in those cases where the test signal (265) transmitted (420) using the signal transceiver (220) is determined (425) by the logic circuitry (230) to be received after it is transmitted (420), the logic circuitry (230) causes the at least one optical light source (130) to be energized to transmit light in the first color (e.g., green). Alternatively, in those cases where the test signal (265) transmitted (420) using the signal transceiver (220) is determined (425) by the logic circuitry (230) to not be received after it is transmitted (420), the logic circuitry (230) causes the at least one optical light source (130) to be energized to transmit light in the second color (e.g., yellow).

In another embodiment, a display device (190) of device (100) and/or circuit (200) provides the means for transmitting the respective maximum measured (410) voltage value or the respective range of measured (410) voltage values. The display device (190) is electronically coupled to the logic circuitry (230). In the embodiment, reporting (430, 435) the measured (410) voltage in method (400) includes causing, e.g., by the logic circuitry (230), a digital readout (192) of the measured (410) voltage to be displayed on the display device (190). Thus, as shown in FIG. 1B, for example, where the measured (410) voltage is 0.305 V, that value is displayed on the display device (190). In one example, reporting (430) the presence of electrical continuity and/or reporting (435) the absence of electrical continuity, between the first (175) and second (180) conductor points includes causing text and/or symbol(s) to be displayed on a display device (190). In the example, a content of the text and/or of the symbol(s) is/are representative of the presence, or the absence, of electrical continuity between the first (175) and second (180) conductor points. For $V_{low} \leq 0.305 \text{ V} \leq V_{high}$, an embodiment has the device displaying a third (red) light source transmit intermittently and flash. A user has the option to actuate an actuator (e.g., press a button) to send the signal. A signal received indicates to the user that a small load is present. A signal not received indicates that there is no continuity. Because a voltage is measured, the probes are in electrical contact with the CUT conductor points.

In yet another embodiment, a speaker (195) provides the means for transmitting the respective maximum measured (410) voltage value or the respective range of measured (410) voltage values. The speaker (195) is electronically coupled to the logic circuitry (230). In the embodiment, reporting (430, 435) the measured (410) voltage in method (400) includes causing, e.g., by the logic circuitry (230), the speaker (195) to transmit one or more audible sounds to the outside (125) of the device (100) and/or circuit (200). In the embodiment, the one or more audible sounds are transmitted, e.g., using the speaker (195), in a tone, or in sequence of tones, corresponding to a respective maximum measured (410) voltage value or a respective range of measured (410) voltage values. In one example, reporting (430) the presence of electrical continuity and/or reporting (435) the absence of electrical continuity, between the first (175) and second (180) conductor points includes causing the one or more audible sounds to be transmitted, e.g., using speaker (195) to the outside (125) of the device (100) and/or circuit (200) in a tone or sequence of tones corresponding to the presence, or the absence, of electrical continuity. In still another embodiment, the means for transmitting the respective maximum measured (410) voltage value or the respective range of measured (410) voltage values includes two or more of the optical light source(s) (130), the display device (190), and the speaker (195). In either, or both, cases, the audible sounds are transmitted at a sound intensity (e.g., volume) that is sufficient to enable a user of the device (100) and/or circuit (200) to hear the audible sounds from the outside (125) of the device (100) and/or the circuit (200). An earpiece can be used in tactical scenarios to prevent a hostile individual from hearing the tone(s).

For use in method (400), the disclosed device (100) and/or circuit (200) may include a variety of useful features providing safety and/or measurement accuracy as compared to know circuit test devices used in the various industries and application environments described herein. In an embodiment, method (400) includes determining, e.g., by the logic circuitry (230) a noise signal duration of the CUT (185). In an example, the noise signal duration is predetermined and specified in the software and/or firmware of controller (234). In one embodiment, the predetermined noise signal duration is about 100 milliseconds (ms). In another embodiment, the predetermined noise signal duration is between 10 ms and 200 ms. In yet another embodiment, the predetermined noise signal duration is between 50 ms and 150 ms.

With respect to noise, it can be important to appropriately analyze and address interfering noise. For example, noise can cause a measured signal to be improperly characterized, such as considering probes to be in electrical contact with a CUT (e.g., a measured voltage), or to be improperly classified as greater than the low threshold voltage or even greater than the high voltage threshold. To address this aspect, an average noise signal duration is determined (referred herein as a "user-selected noise duration), so that readings are only considered if the measured voltage is detected for a duration that is greater than the user-selected noise signal duration. Any transient measurements that occur for less than the user-selected noise signal duration can be disregarded. In this manner, unwanted noise-activation of the device, including optical light sources (e.g., a red light output) is avoided. Furthermore, the user is not distracted by outputs that are impacted by noise, including transient flickering of the red light and prevents activation of the EID and disabling of the actuation push button.

In an example, determining the noise signal duration includes determining, e.g., by the logic circuitry (230), if the measured (410) voltage is less than the low voltage threshold value after a continuous voltage is measured, e.g., by the VMC (210), for a duration of time that is greater than or equal to the determined noise signal duration. Similarly, in some embodiments, determining the noise signal duration includes determining, e.g., by the logic circuitry (230), if the measured (410) voltage is either greater than the high voltage threshold (which would prevent the red light from flickering or to intermittently flash due to noise), or greater than or equal to the low voltage threshold but less than or equal to the high voltage threshold, after a continuous voltage is measured, e.g., by the VMC (210), for a duration of time that is greater than or equal to the determined noise signal duration.

In an embodiment, the transmitting (420) step of method (400) includes transmitting (425) the test signal (265) further in response to receiving, e.g., by the logic circuitry (230), an initiation signal (255) from the actuator (150). Thus, as described in further detail above, in those cases where the measured (420) voltage is less than the low voltage threshold value, and where the actuator (150) is embodied in a button (as shown in FIG. 1B), the user of the disclosed device (100) and/or circuit (200) manually pushes the button to cause the initiation signal (255) to be transmitted to, but not necessarily received by, the logic circuitry (230) in method (400).

In the embodiment, in response to determining, e.g., by the logic circuitry (230) that the measured (410) voltage is greater than the high voltage threshold value, method (400) includes electronically isolating the actuator (150) from the logic circuitry (230) in order to prevent the initiation signal (255) from being received by the logic circuitry (230). In an example, where EID (250) is embodied in the relay, and upon determining that the voltage measured (410) (e.g., an absolute value of the measured (410) voltage) using the VMC (210) in method (400) is greater than the high voltage threshold value, logic circuitry (230) causes the relay to change, or maintain, an operational state (e.g., a first relay operational state) whereby the actuator (150) is electronically isolated from the logic circuitry (230). In this manner, when the measured (410) voltage is greater than the high voltage threshold, the logic circuitry (230) disables use of the actuator (150) to transmit the initiation signal to the logic circuitry (230) even in the event of, for instance, the user pushing the button. With the actuator (150) so disabled to transmit the initiation signal (255) to the logic circuitry (230), the transmitting (420) of the test signal (265) is likewise disabled in method (400).

In the embodiment, in response to determining, e.g., by the logic circuitry (230) that the measured (410) voltage is: less than the low voltage threshold value, or greater than or equal to the low voltage threshold value but less than or equal to the high voltage threshold value, method (400) includes electronically de-isolating the actuator (150) from the logic circuitry (230) in order to allow the initiation signal (255) to be received by the logic circuitry (230). In examples where EID (250) is embodied in the relay, and upon determining that the voltage measured (410) (e.g., an absolute value of the measured (410) voltage) using the VMC (210) in method (400) is: less than the low voltage threshold value, or greater than or equal to the low voltage threshold value but less than or equal to the high voltage threshold value, logic circuitry (230) causes the relay to change, or maintain, an operational state (e.g., a second relay operational state) whereby the actuator (150) is not electronically isolated from the logic circuitry (230). In this manner, when the measured (410) voltage is: less than the low voltage threshold value, or greater than or equal to the low voltage threshold value but less than or equal to the high voltage threshold value, the logic circuitry (230) enables use of the actuator (150) to transmit the initiation signal to the logic circuitry (230) upon, for instance, the user pushing the button. With the actuator (150) so enable to transmit the initiation signal (255) to the logic circuitry (230), the transmitting (420) of the test signal (265) is likewise enabled in method (400).

Example 1: Method Performance

Figure 5:
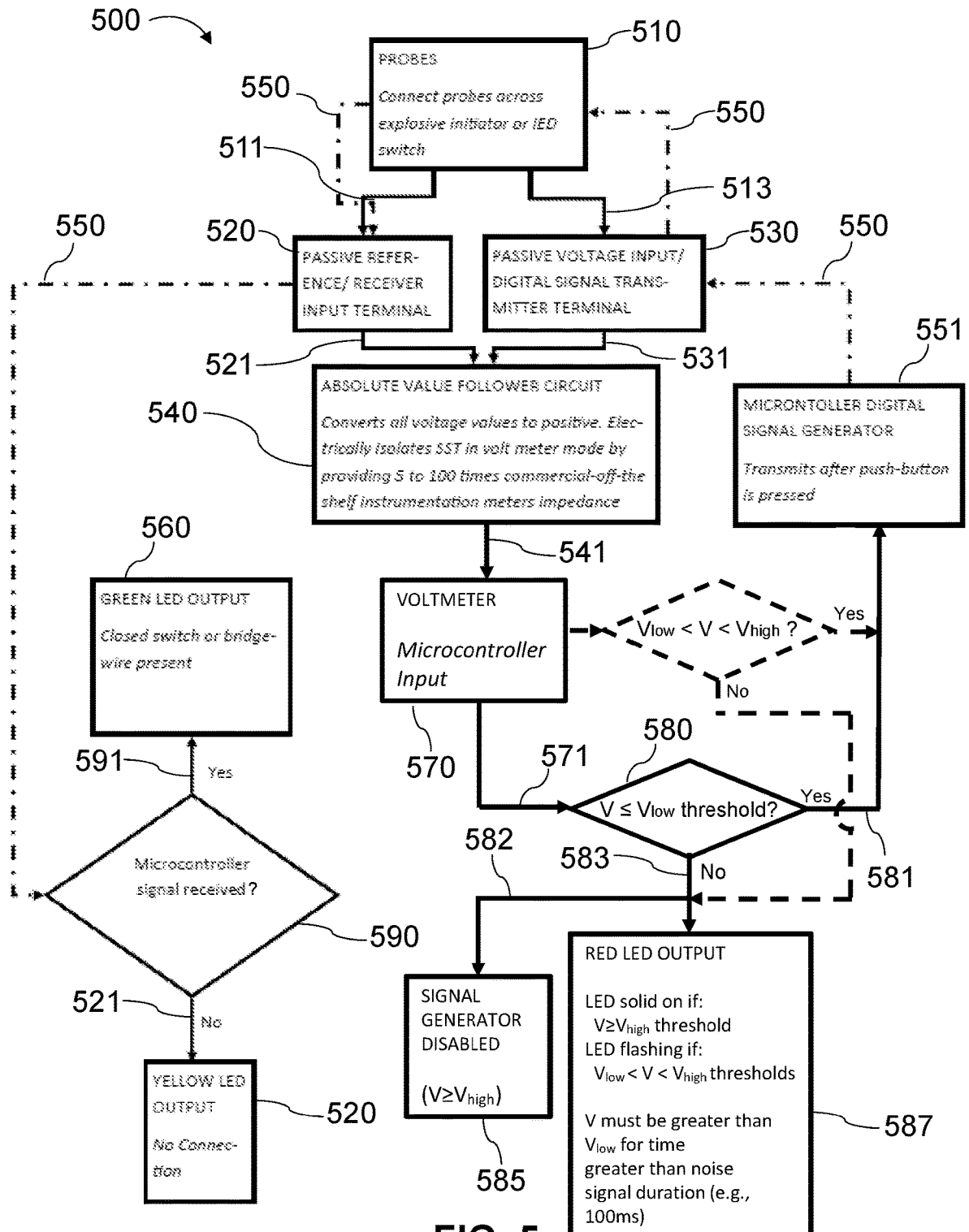
FIG. 5 is a flow chart for performance of the method shown in FIG. 4 according to an embodiment of the disclosure.

FIG. 5 is a flow chart of a process (500) of a use case for performance of the method (400) shown in FIG. 4 according to an embodiment of the disclosure. At a process (500) block (510), the device (100) user connects the first (165) and second (170) probes to the first pair (112-1) of terminals (110 and 120), and then connects the probes (110 and 120) across a CUT, such as a CUT including an explosive initiator of IED switch in the CUT 185. Additionally, or instead of, being performed by a human device (100) and/or circuit (200) user, block (510) may be performed by an autonomous, semi-autonomous, or remotely-controlled robot.

With the master power switch (140) in the on position, at process (500) blocks (520 and 530), differential voltage circuit (212) receives signals (511 and 513) from the probes (110 and 120, respectively). For purposes of this process (500) use case, the first terminal (110) is a passive reference/receiver circuit (224) input terminal and the second terminal (120) is a passive VMC (210) input/transmitter circuit (222) output terminal. Next, at process (500) block (540), the absolute value circuit (214) converts signals (521 and 531) representative of the measured (410) voltage to positive values. The absolute value circuit (214) electrically isolates the VMC (210) from the other components of device (100) and circuit (200) in the voltmeter operational mode by providing from 5 to 100 times the input impedance as compared to the input impedance provided by known commercial "off-the-shelf" test devices having voltmeter functionality.

At process (500) block (570), controller (234) receives a signal (541) representative of the absolute value (e.g., magnitude) of the measured (410) voltage. In the example shown in FIG. 5, signal (541) is converted from an analog signal amplitude to a digital value (571) using an analog-to-digital (ADC) conversion functionality of controller (234). At a logic branch (580) of process (500), controller (234) determines if the digital value (571) for the absolute value of the measured (410) voltage is less than or equal the low voltage threshold value. In response to determining that the digital value (571) for the absolute value of the measured (410) voltage is less than or equal to the low voltage threshold value, a process (500) flow operation (581) causes, at block (551), the controller (234) to: cause a first flow of current to be transmitted to one optical light source (130) embodied in a multi-colored output light emitting diode (MCO-LED) to energize the MCO-LED such that it transmits green light continuously (e.g., non-intermittently without blinking) to the outside (125) of device (100), and transmit the enable signal to the EID (250). This operation in process (500) thereby enables the actuator (150) to be operable by the device (100) user to cause the test signal (265) (denoted as signal (550) in FIG. 5) to be transmitted (420) at block (551) of process (500). In the example shown in FIG. 5, the test signal (265) is transmitted (420) to the CUT (195) by way of the second terminal (120) and the second probe (170).

However, if at process (500) block (580) the controller (234) determines that the digital value (571) of the absolute value of the measured (410) voltage is not less than or equal to the low voltage threshold value, process (500) flow operations (582 and 583) are initiated, instead of process (500) flow (581). Flow operation (582) causes, at process (500) block (585), the controller (234) to refrain from transmitted the enable signal to the EID (250), resulting in the actuator (150) being inoperable by device (100) user. Flow operation (583) causes, at process (500) block (587), the controller (234) to determine of the digital value (571) of the absolute value of the measured (410) voltage is either greater than or equal to the high voltage threshold value, or greater than the low voltage threshold value but less than the high voltage threshold value. Where, at block (587), controller (234) determines that the digital value (571) of the absolute value of the measured (410) voltage is greater than or equal to the high voltage threshold value, controller (234) causes a second flow of current (of a different value than the first flow of current) to be transmitted to the MCO-LED to energize the MCO-LED such that it transmits red light continuously (e.g., non-intermittently without blinking) to the outside (125) of device (100). Alternatively, where, at block (587), controller (234) determines that the digital value (571) of the absolute value of the measured (410) voltage greater than the low voltage threshold value but less than the high voltage threshold value, controller (234) causes the second flow of current to be intermittently transmitted to the MCO-LED to energize the MCO-LED such that it transmits red light discontinuously (e.g., with red blinking) to the outside (125) of device (100). In process (500), at block (587), the controller (234) causes the MCO-LED to be energized to transmit red light either continuously or with blinking only after the digital value (571) of the measured (410) voltage is greater than the low voltage threshold value a predetermined noise signal duration for the example process (500) use case, such as for 100 ms. For $V_{low} \leq V \leq V_{high}$, the red light may flash and the device allows the user to transmit a test signal.

Following the transmission (420) of signal (550) at block (551) as described above, at a logic branch (590) of process (500), controller (234) determines (425) if the signal (550) is received by the receiver circuit (224). In response to determining (425) that the signal (550) is received, a process (500) flow operation (591) causes, at block (560), the controller (234) to cause the first flow of current to be transmitted to the MCO-LED to energize the MCO-LED such that it transmits green light continuously to the outside (125) of the device (100). The MCO-LED being illuminated green at process (500) block (560) indicates the presence of electrical continuity between the first (165) and second (170) conductor points in the CUT (185). In the use case of process (500), the presence of electrical continuity indicates the presence of a closed switch, or a bridge wire, between the first (165) and second (170) conductor points. Alternatively, in response to determining (425) that the signal (550) is not received, a process (500) flow operation (521) causes, at block (520), the controller (234) to cause a third flow of current that is different from the first and second flows of current to be transmitted to the MCO-LED to energize the MCO-LED such that it transmits yellow light continuously to the outside (125) of device (100). The MCO-LED being illuminated yellow at process (500) block (520) indicates the absence of electrical continuity between the first (165) and second (170) conductor points in the CUT (185) (e.g., either the switch or bridgewire are open; or the probes are not connected to the conductor point(s)). In the use case of process (500), the absence of electrical continuity indicates the lack of an electrical connection between the first (165) and second (170) conductor points. The yellow illumination may also indicate that the probes are not connected to the conductor points. Physical probe inspection by a user experienced in the art may determine if the latter is true. An additional set of probes attached adjacent to the first and second probes respectively by a user experienced in the operation of the device may be used to verify the probes are connected to the CUT using the method described above. If they are determined to be connected to the CUT, the switch state is open or a detonator bridgewire is not present. If they are determined not to be connected, the second pair of probes can be used to analyze the switch or bridgewire state.

Example 2: Simultaneous Continuity Assessment

Referring to FIG. 1B, where the number (n) of pairs of terminals is 4, for instance, the device (100) may employ up to 8 probes to analyze up to 8 conductor points at a time in the CUT(s) (185) using method (400). In this use case example, with the 4 terminal pairs arranged in a first column (e.g., terminals 1-*a*, 2-*a*, 3-*a* and 4-*a*) and a second column (e.g., terminals 1-*b*, 2-*b*, 3-*b* and 4-*b*), and with only the terminals of the first column configured for transmitting (420) the test signal (265), up to 16 combinations of voltages and connection states between the 8 conductor points may be assessed at a time in method (400), as shown in the table below.

|  | Circuit State Combinations (n = 4) Col. 1 | | | |
| --- | --- | --- | --- | --- |
| Col. 2 | 1-a | 2-a | 3-a | 4-a |
| 1-b | - 1 - | - 5 - | - 9 - | - 13 - |
| 2-b | - 2 - | - 6 - | - 10 - | - 14 - |
| 3-b | - 3 - | - 7 - | - 11 - | - 15 - |
| 4-b | - 4 - | - 8 - | - 12 - | - 16 - |

For each of the 16 test combinations (e.g., "-1-", . . . , "-16-"), the controller (234) orchestrates any or all of the above described steps of method (400) in an iterative manner in this use case example, and may report the test results obtained in several ways. In one embodiment, the controller (234) orchestrates each of the 16 iterations in response to the device (100) user selecting a respective combination using, for instance, dial knob (118). In this embodiment, the voltage and electrical continuity results for each test iteration may be displayed statically on the display device (190). In another embodiment, controller (234) reports voltage and electrical continuity results for each test iteration using the display device (190) with a "rolling" sequence of reported results for each tested combination. In this embodiment, the dial knob (118) need not be included in device (100).

The iterative performance of method (400) with the rolling display, or otherwise automated, reporting of test results for the combinations enables a substantially more rapid way to obtain pertinent testing results for the CUT (185) as compared to known circuit test devices and techniques. In some use cases, the automation of method (400) is facilitated by configuring the device (100) and/or circuit (200) to transmit (420) the test signal (265) for any measured (410) voltages less than the high voltage threshold value.

In any of the above embodiments described with respect to this Example 2, controller (234) may cause the test result for each iteration of method (400) for each combination in memory for later retrieval by device (100) user using, for instance, the display device 190. Additionally, or instead, on command of the device (100) user, controller (234) may transmit data to an attached printer (not shown in the figures) to generate a paper copy of the test results. In some embodiments, device (100) and/or circuit (200) includes a wired and/or wireless data transmitter for sending test result data to one or more locations remote from a location at which device (100) is being used to perform analysis of the CUT(s) (185). In this manner, the need for a user to take note on all the different measurements and connection configurations is avoided.

For example, with 8 terminals and probes we can simultaneously analyze up to four CUTs at one time. A dial can switch to each pair or there can be a rolling output that checks the CUTs in a sequence, with the results indicated on a display or readout. In this manner, all combinatorial relationships can be sampled with output results provided on a screen. This example is useful for electrical continuity measurement of wire bundles for simultaneous individual wire continuity assessment. There are many examples, including CAT 5 cable assessment, four conductor lines (one insulating sheath), etc. In this manner, a user can quickly and reliably identify short circuits and the like, including arising from defective or degraded wire insulation that brings wires into unwanted electrical contact with each other. In this example, an embodiment includes the circuit configured to automatically send the signal when less than the high voltage threshold.

Example 3: Functional Device Check

To provide additional reassurance of device functionality ahead of use, various components may be incorporated into any of the methods and systems provided herein. For example, a power indicator light may be provided on the housing to indicate that the device is on and under power. Similarly, a low-power light may be used to indicate when it is time to replace the power source (e.g., battery).

Figure 6:
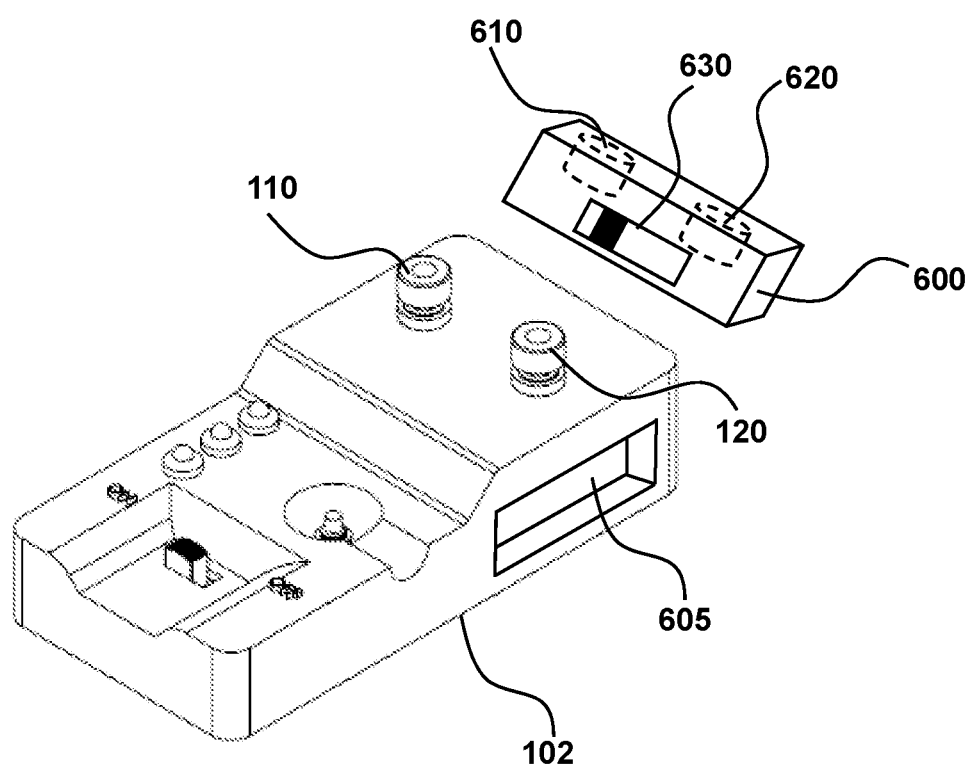
FIG. 6 illustrates a test block that can be used in a bump test to confirm device functionality. For ease of illustration, the test block is illustrated as a separate external component, but can be integrated within the housing, as desired.

Another component may be used to implement a process that verifies the device is performing properly (e.g., a "bump test"). Preferably, the bump test confirms there will be a proper output signal reflecting electrical continuity or discontinuity conditions, including for the various V conditions relative to $V_{low}$ and $V_{high}$. Accordingly, provided herein is a test block having a power source, circuit and a slider switch that is a functional substitute to reflect conditions of a CUT. The test block is connected to the device probes with the slider switch reflecting a high voltage condition (device should display a red light) and a low voltage condition (device should not display a red light), unless the test button is activated (device should display a green light). FIG. 6 illustrates a test block 600 with a switch 630 and embedded power and source and test block circuit (not shown) to provide a power and no power condition. The test block, when not in use, may removably connect or mount to device housing 102, such as into test block receiver 605 in the housing. When in use, test block is removed from receiver 605 and forced to mate with terminals 110 120 (or probes connected thereto) via corresponding test block contacts 610 620. As desired, the test block may be integrated within housing, thereby minimizing handling and tracking of additional components, with switch 630 accessible to a user.

Various embodiments disclosed herein are to be taken in the illustrative and explanatory sense, and should in no way be construed as limiting of the present disclosure.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure.

Every formulation or combination of components described or exemplified herein can be used to practice the invention, unless otherwise stated.

Whenever a range is given in the specification, for example, a size range, a number range, a pore size range, a porosity range, a thickness range, LOD range, a temperature range, a time range, a flow-rate range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A method comprising:
    measuring, by a voltage measurement circuit (VMC), a voltage between a first conductor point and a second conductor point of a circuit under test (CUT);
    determining, by logic circuitry, if the measured voltage is less than a low voltage threshold value, wherein the low voltage threshold value is selected so as to indicate electrical continuity between the first and second conductor points; and
    in response to determining that the measured voltage is less than the low voltage threshold value:
        transmitting, by a signal transceiver, a test signal to one of the first and second conductor points;
        determining, by the logic circuitry, if the test signal is received, by the signal transceiver, after being transmitted;
            in response to determining that the test signal is received, reporting, by the logic circuitry, a presence of electrical continuity between the first and second conductor points; or
            in response to determining that the test signal is not received, reporting, by the logic circuitry, an absence of electrical continuity between the first and second conductor points, or lack of electrical contact between the VMC and at least one of the first and second conductor points;
    further determining, by the logic circuitry, if the measured voltage is greater than or equal to the low voltage threshold value but less than or equal to a high voltage threshold value, wherein the high voltage threshold value is greater than the low voltage threshold value and is selected so as to indicate an absence of electrical continuity between the first and second conductor points;
    in response to determining that the measured voltage is greater than or equal to the low voltage threshold value but less than or equal to the high voltage threshold value, confirming electrical contact of the VMC with the first and second conductor points, wherein the confirming step comprises:
        transmitting, by the signal transceiver, the test signal to the one of the first and second conductor points;
        determining, by the logic circuitry, if the test signal is received, by the signal transceiver, after being transmitted; and
            in response to determining that the test signal is received, reporting, by the logic circuitry, a presence of a small resistive load between the first and second conductor points; or
            in response to determining that the test signal is not received, reporting, by the logic circuitry, the absence of electrical continuity between the first and second conductor points.

2. The method of claim 1 further comprising:
    determining, by the logic circuitry, if the measured voltage is greater than a high voltage threshold value, wherein the high voltage threshold value is greater than the low voltage threshold value and is selected so as to indicate an absence of electrical continuity between the first and second conductor points; and
    in response to determining that the measured voltage is greater than the high voltage threshold value:
        confirming electrical contact of the VMC with the first and second conductor points; and reporting, by the logic circuitry: a presence of a high resistance between the first and second conductor points, or the absence of electrical continuity between the first and second conductor points.

3. The method of claim 1, wherein measuring the voltage comprises measuring the voltage using a high input impedance VMC having an input impedance of between 10 MΩ to 1 GΩ.

4. The method of claim 1 further comprising reporting, by the logic circuitry, the measured voltage relative to the low voltage threshold value.

5. The method of claim 1, wherein reporting the measured voltage comprises causing one or more of:
displaying a digital readout of a value of the measured voltage on a display device;
energizing one or more optical light sources, wherein when energized, the one or more optical light sources transmit light in a color corresponding to a respective maximum measured voltage value or a respective range of measured voltage values; and/or
transmitting one or more audible sounds using a speaker, wherein the one or more audible sounds are transmitted in a tone or sequence of tones corresponding to a respective maximum measured voltage value or a respective range of measured voltage values.

6. The method of claim 1, wherein determining if the measured voltage is less than the low voltage threshold value comprises determining if an absolute value of the measured voltage is less than the low voltage threshold value.

7. The method of claim 1 further comprising determining, by the logic circuitry, a noise signal duration of the CUT, wherein for the noise signal duration that is less than a user-selected noise duration identifying the measured voltage as transient noise and preventing the transient noise from adversely impacting the reporting.

8. The method of claim 7, wherein the measured voltage is greater than or equal to a high voltage threshold.

9. The method of claim 7, wherein the measured voltage is greater than or equal to the low voltage threshold and less than or equal to a high voltage threshold, and the logic circuitry prevents for the noise signal duration that is less than the user-selected noise duration from reporting the measured voltage as greater than the low voltage threshold and less than the high voltage threshold, wherein optionally the user-selected noise duration is greater than or equal to 50 ms.

10. The method of claim 1 further comprising determining, by the logic circuitry, if the measured voltage is greater than a high voltage threshold value, wherein:
the high voltage threshold value is greater than the low voltage threshold value and is selected so as to indicate the absence of electrical continuity between the first and second conductor points;
determining if the measured voltage is greater than the high voltage threshold value comprises determining if an absolute value of the measured voltage is greater than the high voltage threshold value; and
the method further comprises reporting the absence of electrical continuity in response to determining that the measured voltage is greater than the high voltage threshold value.

11. The method of claim 1, further comprising:
determining, by the logic circuitry, if the measured voltage is greater than or equal to the low voltage threshold value but less than or equal to the high voltage threshold value; and
further in response to determining that the measured voltage is less than the low voltage threshold value, and further in response to determining that the test signal is received, causing at least one optical light source to be energized to transmit light in a first color, indicating the presence of electrical continuity between the first and second conductor points; or
further in response to determining that the measured voltage is less than the low voltage threshold value, and further in response to determining that the test signal is not received, causing the at least one optical light source to be energized to transmit light in a second color, indicating: the absence of electrical continuity between the first and second conductor points, or the lack of electrical contact between the VMC and the at least one of the first and second conductor points; or
further in response to determining that the measured voltage is greater than the high voltage threshold value, causing the at least one optical light source to be energized to transmit light in a third color, indicating the absence of electrical continuity between the first and second conductor points; or
in response to determining that the measured voltage is greater than or equal to the low voltage threshold value but less than or equal to the high voltage threshold value:
transmitting, by the signal transceiver, the test signal to the one of the first and second conductor points;
determining, by the logic circuitry, if the test signal is received, by the signal transceiver, after being transmitted; and
in response to determining that the test signal is received,
reporting, by the logic circuitry, the presence of electrical continuity between the first and second conductor points, by causing the at least one optical light source to be energized to transmit light in the first color; or
in response to determining the test signal is not received:
reporting, by the logic circuitry, the absence of electrical continuity between the first and second conductor points, by causing the at least one optical light source to be energized to transmit light in the second color.

12. The method of claim 1, wherein a voltage amplitude or a current amplitude of the test signal is less than or equal to a tenth of a no-fire condition of the CUT.

13. The method of claim 1, wherein transmitting the test signal comprises transmitting the test signal further in response to receiving, by the logic circuitry, an initiation signal from an actuator.

14. The method of claim 13, further comprising:
determining, by the logic circuitry, if the measured voltage is greater than a high voltage threshold value, wherein the high voltage threshold value is greater than the low voltage threshold value and is selected so as to indicate the absence of electrical continuity between the first and second conductor points;
electronically isolating the actuator from the logic circuitry in response to determining that the measured voltage is greater than the high voltage threshold value;
wherein the actuator coupled to the logic circuitry is for transmitting an initiation signal to the logic circuitry; and
a means for selectively electronically isolating the actuator from the logic circuitry, wherein the logic circuitry is further configured to:
further in response to determining that the measured voltage is greater than the high voltage threshold value, electronically isolate the actuator from the logic circuitry using the means for electronically isolating; or
transmit the test signal further in response to receiving the initiation signal from the actuator.

15. The method of claim 1, wherein at least one of: reporting the presence of electrical continuity, and reporting the absence of electrical continuity, comprises causing at least one of:
text to be displayed on a display device, wherein a content of the text is representative of the presence, or the absence, of electrical continuity;
a symbol to be displayed on a display device, wherein a content of the symbol is representative of the presence, or the absence, of electrical continuity;
one or more optical light sources to be energized, wherein, when energized, the one or more optical light sources transmit light in a color corresponding to the presence, or the absence, of electrical continuity; and
one or more audible sounds to be transmitted using a speaker, wherein the one or more audible sounds are transmitted in a tone or sequence of tones corresponding to the presence, or the absence, of electrical continuity.

16. The method of claim 1, wherein a plurality of CUT's are simultaneously assessed for electrical continuity, wherein the method further comprises the steps of:
measuring by the VMC a voltage between a plurality of paired conductor points; and
sampling all combinatorial relationships between the measured voltage from each of the plurality of paired conductor points.

17. A circuit comprising:
a voltage measurement circuit (VMC) for measuring a voltage between a first conductor point and a second conductor point of a circuit under test (CUT);
a signal transceiver; and
logic circuitry coupled to: the VMC, and the signal transceiver, and configured to:
determine if the measured voltage is:
less than a low voltage threshold value; or
greater than a high voltage threshold value; or
greater than or equal to the low voltage threshold value and less than or equal to the high voltage threshold value,
wherein the low voltage threshold value is selected so as to indicate electrical continuity between the first and second conductor points, and wherein the high voltage threshold value is selected so as to indicate an absence of electrical continuity between the first and second conductor points; and
in response to determining that the measured voltage is:
less than the low voltage threshold value:
transmit, using the signal transceiver, a test signal to one of the first and second conductor points;
determine if the test signal is received, using the signal transceiver, after being transmitted; and
in response to determining that the test signal is received, report a presence of electrical continuity between the first and second conductor points; or
in response to determining that the test signal is not received, report: an absence of electrical continuity between the first and second conductor points, or lack of electrical contact between the VMC and at least one of the first and second conductor points; or
greater than the high voltage threshold value:
report the absence of electrical continuity between the first and second conductor points; or
greater than or equal to the low voltage threshold value but less than or equal to the high voltage threshold value:
transmit, using the signal transceiver, the test signal to the one of the first and second conductor points;
determine if the test signal is received, using the signal transceiver, after being transmitted; and
in response to determining that the test signal being received, report the presence of electrical continuity between the first and second conductor points; or
in response to determining that the test signal is not received, report the absence of electrical continuity between the first and second conductor points.

18. The circuit of claim 17, further comprising a means for transmitting a respective maximum measured voltage value or a respective range of measured voltage values to a user of the circuit, wherein the logic circuitry is further configured to report the measured voltage using the transmitting means.

19. The circuit of claim 17, further comprising:
an actuator coupled to the logic circuitry for transmitting an initiation signal to the logic circuitry; and
a means for selectively electronically isolating the actuator from the logic circuitry,
wherein the logic circuitry is further configured to:
further in response to determining that the measured voltage is greater than the high voltage threshold value, electronically isolate the actuator from the logic circuitry using the means for electronically isolating; or
transmit the test signal further in response to receiving the initiation signal from the actuator.

20. A device comprising:
a housing;
a power supply disposed within the housing;
an interface positioned on or through a surface of the housing and comprising at least two terminals accessible from outside of the housing;
an actuator positioned on or through the surface of the housing and accessible from the outside of the housing;
a circuit disposed within the housing and coupled to: the power supply, the interface, and the actuator, the circuit comprising:
a high input impedance voltage measurement circuit (VMC) for measuring, via the interface, a voltage between a first conductor point and a second conductor point of a circuit under test, wherein the high input impedance VMC is configured to generate a signal representative of the absolute value of the measured voltage;
a signal transceiver;
three optical light sources; and
logic circuitry coupled to: the high input impedance VMC, the signal transceiver, and the three optical light sources, the logic circuitry configured to:
receive the signal representative of the absolute value of the measured signal;

determine, based on the signal representative of the absolute value of the measured signal, if:
  the absolute value of the measured voltage is less than a low voltage threshold value; or
  the absolute value of the measured voltage is greater than a high voltage threshold value; or
  the absolute value of the measured voltage is greater than or equal to the low voltage threshold value but less than or equal to the high voltage threshold value,
  wherein the low voltage threshold value is selected so as to indicate electrical continuity between the first and second conductor points, and wherein the high voltage threshold value is selected so as to indicate an absence of electrical continuity between the first and second conductor points; and
in response to determining that the absolute value of the measured voltage is:
  less than the low voltage threshold value:
    cause a first optical light source of the three optical light sources to be energized to transmit light in a first color to the outside of the housing;
    enable use of the actuator to transmit an initiation signal to the logic circuitry;
    transmit, via the interface and using the signal transceiver, a test signal to one of the first and second conductor points in response to receiving the initiation signal;
    determine if the test signal is received, via the interface and using the signal transceiver, after being transmitted; and
    in response to determining that the test signal is received, report a presence of electrical continuity between the first and second conductor points, by causing the first optical light source to be energized to transmit light in the first color to the outside of the housing; or
    in response to determining that the test signal is not received, report: the absence of electrical continuity between the first and second conductor points, or lack of electrical contact between the two terminals and at least one of the first and second conductor points, by causing a second light source of the three optical light sources to be energized to transmit light in a second color to the outside of the housing; or
  greater than the high voltage threshold value:
    disable use of the actuator to transmit the initiation signal to the logic circuitry; and
    report the absence of electrical continuity between the first and second conductor points, by causing a third optical light source of the three optical light sources to be energized to transmit light in a third color to the outside of the housing; or
  greater than or equal to the low voltage threshold value and less than or equal to the high voltage threshold value:
    cause the third optical light source to be energized to transmit light intermittently in the third color to the outside of the housing;
    enable use of the button to transmit an initiation signal to the logic circuitry;
    transmit, via the interface and using the signal transceiver, the test signal to the one of the first and second conductor points in response to receiving the initiation signal;
    determine if the test signal is received, via the interface and using the signal transceiver, after being transmitted; and
    in response to determining that the test signal is received, report the presence of electrical continuity between the first and second conductor points, by causing the first optical light source to be energized to transmit light in the first color to the outside of the housing; or
    in response to determining that the test signal is not received, report the absence of electrical continuity between the first and second conductor points, by causing the second light source to be energized to transmit light in a second color to the outside of the housing.

21. The device of claim 20, further comprising a test block for confirming device functionality by a bump test, wherein the test block is configured to display three possible output states selected from the group consisting of:
  a measured voltage greater than a low voltage threshold;
  a short between the terminals; and
  no connection between the terminals.

* * * * *